United States Patent
Horibe et al.

(10) Patent No.: US 12,142,603 B2
(45) Date of Patent: Nov. 12, 2024

(54) BONDING OF BRIDGE TO MULTIPLE SEMICONDUCTOR CHIPS

(71) Applicant: International Business Machines Corporation, Armonk, NY (US)

(72) Inventors: Akihiro Horibe, Yokohama (JP); Takahito Watanabe, Yokohama (JP); Toyohiro Aoki, Yokohama (JP); Takashi Hisada, Hachiouji (JP); Hiroyuki Mori, Yasu (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 18/324,743

(22) Filed: May 26, 2023

(65) Prior Publication Data
US 2023/0299067 A1    Sep. 21, 2023

Related U.S. Application Data

(62) Division of application No. 17/303,333, filed on May 27, 2021, now Pat. No. 11,735,575.

(51) Int. Cl.
| | |
|---|---|
| H01L 25/00 | (2006.01) |
| H01L 23/00 | (2006.01) |
| H01L 23/538 | (2006.01) |

(52) U.S. Cl.
CPC ............ *H01L 25/50* (2013.01); *H01L 23/538* (2013.01); *H01L 24/75* (2013.01); *H01L 24/81* (2013.01);
(Continued)

(58) Field of Classification Search
None
See application file for complete search history.

(56) References Cited

U.S. PATENT DOCUMENTS

| | | |
|---|---|---|
| 7,348,666 B2 | 3/2008 | Stoneham |
| 7,681,309 B2 | 3/2010 | Miller |

(Continued)

FOREIGN PATENT DOCUMENTS

| | | |
|---|---|---|
| CN | 107017238 A | 8/2017 |
| CN | 111357102 A | 6/2020 |

(Continued)

OTHER PUBLICATIONS

IBM: List of IBM Patents or Patent Applications Treated as Related. Filed Herewith. 2 pages.

(Continued)

*Primary Examiner* — Telly D Green
(74) *Attorney, Agent, or Firm* — Yuanmin Cai

(57) ABSTRACT

Interconnecting a first chip and a second chip includes mounting the first and second chips to a chip handler having an opening and at least one support surface. Each of the first chip and the second chip has a first surface including a first set of terminals and a second surface opposite to the first surface. The first surface of the first chip and the first surface of the second chip mounted to the chip handler are supported by the at least one support surface of the chip handler. The first and second chips are placed on a chip support member with the chip handler from the second surfaces. A bridge member is inserted by a bridge handler through the opening of the chip handler to place the bridge member onto the first sets of terminals of the first and second chips that are exposed from the opening.

8 Claims, 34 Drawing Sheets

(52) U.S. Cl.
CPC .............. *H01L 24/83* (2013.01); *H01L 24/92* (2013.01); *H01L 2224/75101* (2013.01); *H01L 2224/75755* (2013.01); *H01L 2224/75981* (2013.01); *H01L 2224/81054* (2013.01); *H01L 2224/81136* (2013.01); *H01L 2224/83951* (2013.01); *H01L 2224/92125* (2013.01)

(56) References Cited

U.S. PATENT DOCUMENTS

| | | | |
|---|---|---|---|
| 9,142,532 | B2 | 9/2015 | Suga |
| 10,483,156 | B2 | 11/2019 | Leobandung |
| 10,490,503 | B2 | 11/2019 | Collins |
| 10,763,216 | B2 | 9/2020 | Braunisch |
| 2007/0216039 | A1* | 9/2007 | Arai .................. H01L 23/3121 257/E23.125 |
| 2011/0025344 | A1* | 2/2011 | Kumagai ........... G01R 31/2893 324/555 |
| 2012/0280404 | A1 | 11/2012 | Kwon |
| 2016/0071818 | A1 | 3/2016 | Wang |
| 2017/0092614 | A1 | 3/2017 | Iwasaki |
| 2018/0005945 | A1 | 1/2018 | Pietambaram |
| 2019/0164806 | A1 | 5/2019 | Leobandung |
| 2020/0013667 | A1 | 1/2020 | Leobandung |
| 2020/0035603 | A1 | 1/2020 | Rubin |
| 2020/0035604 | A1 | 1/2020 | Rubin |
| 2020/0176383 | A1 | 6/2020 | Arvin |
| 2020/0243479 | A1 | 7/2020 | Arvin |
| 2021/0020529 | A1 | 1/2021 | McHerron |
| 2021/0134724 | A1 | 5/2021 | Rubin |
| 2021/0134728 | A1 | 5/2021 | Rubin |
| 2021/0398906 | A1 | 12/2021 | Qian |
| 2022/0384412 | A1 | 12/2022 | Horibe |

FOREIGN PATENT DOCUMENTS

| | | |
|---|---|---|
| TW | 201620815 A | 6/2016 |
| WO | 2015023232 A1 | 2/2015 |
| WO | 2019106455 A1 | 6/2019 |
| WO | 2022249077 A1 | 12/2022 |

OTHER PUBLICATIONS

International Searching Authority, "Notification of International Search Report and Written Opinion or Declaration", International Application No. PCT/IB2022/054874, Mailed Sep. 14, 2022, 7 pages.

Mahajan, et al., "Embedded Multi-Die Interconnect Bridge (EMIB)—A High Density, High Bandwidth Packaging Interconnect", 2016 IEEE 66th Electronic Components and Technology Conference, p. 557-565, <https://ieeexplore.ieee.org/document/7545486>.

* cited by examiner

FIG. 19B   FIG. 19C

BONDING OF BRIDGE TO MULTIPLE SEMICONDUCTOR CHIPS

BACKGROUND

The present invention generally relates to the field of multi-chip interconnection technology, and more particularly to a chip handler for interconnecting a plurality of semiconductor chips.

Currently, there is an increased interested in high-density interconnections between multiple chips such as those between a CPU (Central Processing Unit) and a memory, and an AI (Artificial Intelligence) accelerator and a memory. A promising structure for interconnecting multiple chips is a bridge structure in which multiple chips are connected by a bridge member that implements high-density interconnections.

To build the bridge structure, appropriate tools and processes for interconnecting multiple chips are required. The bridge assembling process is still challenging due to difficulty in the chip alignment and the fragile property of the intermediate structure. Generally, an accurate alignment is required between the chips and the bridge member connecting them not only horizontally but also vertically. To achieve the dense interconnections between the chips through the bridge member, relatively smaller bumps such as micro-bumps are employed.

As solder volume for the bump decreases, difficulty, especially for the vertical alignment, increases. Furthermore, to prevent misalignment between the chips, which would be subsequently bonded on other substrate, each alignment between the chip and the bridge member is required to be more accurate, which poses additional difficulty in bridging the multiple chips. By way of example, alignment accuracy less than 5 micrometer in horizontal dimensions and alignment accuracy less than 2 micrometer in vertical dimension are required for 20 mm die size with 30 micrometer-pitch bumps. Also, end-to-end support for the fragile bridged module is required throughout a course from the chip alignment via the bridge chip joining to the underfilling.

Therefore, there is a need for alternative multi-chip interconnection techniques for aligning a plurality of chips and a bridge member appropriately and supporting the chips and the bridge member during the bridging process.

SUMMARY

According to an embodiment of the present invention, a method for interconnecting a first chip and a second chip by a bridge member is provided. Each of the first chip and the second chip has a first surface including a first set of terminals formed thereon and a second surface opposite to the first surface. The method includes mounting the first chip and the second chip to a chip handler having an opening and at least one support surface, wherein the first surfaces of the first chip and the second chip mounted to the chip handler are supported by the at least one support surface of the chip handler. The method includes also placing the first chip and the second chip on a chip support member with the chip handler from the second surfaces. The method further includes inserting a bridge member by a bridge handler through the opening of the chip handler to place the bridge member onto the first sets of terminals of the first chip and the second chip.

The method according to the embodiment of the present invention enables accurate alignment between the first chip and the second chip and between each of the first and second chips and the bridge member since the first chip and the second chip are pre-aligned against the chip handler in mounting the first chip and the second chip to the chip handler. The bridge member is then placed on the first and second chips, which are pre-aligned against the chip handler, and then the bridged multiple chips can be bonded to a substrate simultaneously. Also, the first and second chips and the intermediate bridged structures are supported by the at least one support surface of the chip handler during the process.

In a preferred embodiment, the method further includes assembling the chip handler, the chip support member and the bridge handler to provide a chamber space that accommodates the first sets of terminals of the first chip and the second chip and terminals of the bridge member inside the chamber space. Thereby, the first sets of terminals of the first chip and the second chip and terminals of the bridge member are placed in controlled environment during the bridging process.

In a further preferred embodiment, the method further includes suppling reduction gas into the chamber space to clean the first sets of terminals of the first chip and the second chip and/or the terminals of the bridge member. Thereby, cleaning-less joining in reducing atmosphere can be achieved. Also, since the reduction gas can be retained in the chamber space, the corrosion of the parts of the apparatus outside the chamber space due to the corrosive nature of the reduction gas may also be prevented.

In a particular embodiment, mounting the first chip and the second chip to the chip handler includes sucking, by a plurality of first holes formed on the at least one support surface, the first surface of the first chip; and sucking, by a plurality of second holes formed on the at least one support surface, the first surface of the second chip.

In a particular embodiment, mounting the first chip and the second chip to the chip handler includes sucking the first surfaces of the first chip and the second chip by a first set of holes formed on the at least one support surface and routed from one of a bonding stage side and a bonding head side. Placing the first chip and the second chip on the chip support member includes sucking the first surfaces of the first chip and the second chip by a second set of holes formed on the at least one support surface and routed from other of the bonding stage side and the bonding head side. Placing the first chip and the second chip on the chip support member includes further releasing the chip handler from the one of the bonding stage side and the bonding head side. Thereby, fixing between the at least one support surface of the chip handler and the first surfaces of the first chip and the second chip can be controlled by utilizing suction at the holes from both a bonding head side and a bonding stage side.

In a particular embodiment, the method further includes releasing a bridged module including the first chip, the second chip and the bridge member bonded to the first chip from the chip handler, and the second chip. The method further includes mounting the bridged module on a substrate.

In a particular embodiment, the bridge member has third sets of terminals. The method further includes dispensing an underfill material, from a side of the second surfaces, to a place around joints between the first sets of terminals of the first chip and the second chip and the third sets of terminals of the bridge member; and curing the underfill material.

According to another embodiment of the present invention, a chip handler for handling a first chip and a second chip is provided. Each of the first chip and the second chip has a first surface including a first set of terminals formed thereon and a second surface opposite to the first surface. The chip handler includes at least one support surface for supporting the first surfaces of the first chip and the second chip when the first chip and the second chip are mounted to the chip handler. The chip handler also includes an opening used for inserting a bridge member therethrough followed by placing the bridge member onto the first sets of terminals of the first chip and the second chip. The second surfaces of the first chip and the second chip are exposed from the chip handler.

The chip handler according to the embodiment of the present invention enables accurate alignment between the first chip and the second chip and between each of the first and second chips and the bridge member since the chip handler provides functionality of pre-alignment between the first chip and the second chip. The bridge member can be placed on the first and second chips, which are pre-aligned against the chip handler, and then the bridged multiple chips would be bonded to a substrate simultaneously. Also, the first and second chips and the intermediate bridged structures are supported by the at least one support surface of the chip handler during the bridging process.

Additional features and advantages are realized through the techniques of the present invention. Other embodiments and aspects of the invention are described in detail herein and are considered a part of the claimed invention.

BRIEF DESCRIPTION OF THE DRAWINGS

The following detailed description, given by way of example and not intended to limit the invention solely thereto, will best be appreciated in conjunction with the accompanying drawings, in which:

FIG. 19B is a detailed view of the chip handle structure of FIG. 19A depicting using an adhesive material as the fixing member, according to an embodiment of the present invention;

FIG. 19C is a detailed view of the chip handle structure of FIG. 19A depicting using a pair of a metal stud bump and a pad as a fixing member, according to an embodiment of the present invention;

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1A:
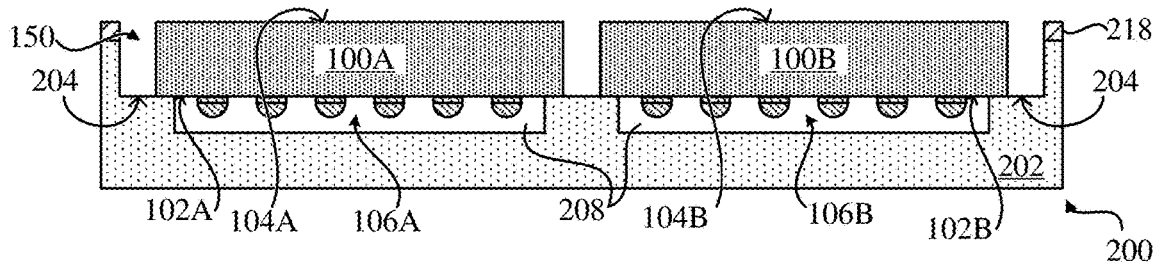
FIG. 1A is a cross-sectional view of a chip handler and a bridged module carried by the chip handler used in a manufacturing apparatus of a bridged multichip module, according to an embodiment of the present invention.
Figure 1B:
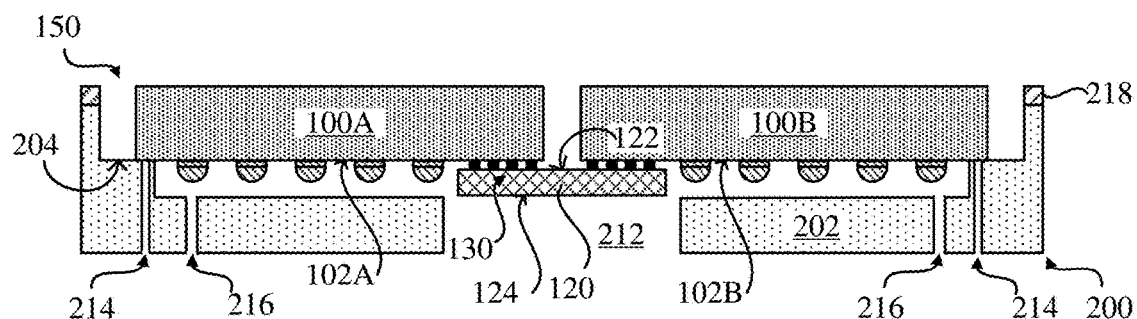
FIG. 1B is a cross-sectional view of the chip handler across line B-B', according to an embodiment of the present invention.

Detailed embodiments of the claimed structures and methods are disclosed herein. However, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

Hereinafter, the present invention will be described with respect to particular embodiments, but it will be understood by those skilled in the art that the embodiments described below are mentioned only by way of examples and are not intended to limit the scope of the present invention.

One or more embodiments according to the present invention are directed to an apparatus and a method for interconnecting a plurality of chips by a bridge member by using at least one of a chip handler, a chip support member, and a bridge handler. One or more embodiments according to the present invention may also be directed to at least one of the chip handler, the chip support member, and the bridge handler.

Each chip to be bridged has a first surface including a first set of terminals formed thereon and a second surface opposite to the first surface. The first set of terminals of each chip is used for bridging. Hereinbelow, the first surface where the first set of terminals is formed is often referred to as a 'front surface' and the second surface opposite to the front surface is often referred to as a 'back surface'. In an embodiment, the front surface of each chip also includes a second set of terminals used for joining to a substrate, to which a resultant bridged module would be mounted during a subsequent process. The terminals may have any suitable form. In an embodiment, the first sets of terminals is a set of contact pads with or without a pre-solder and the second set of terminals is a set of bumps.

The chip handler is used for handling a plurality of chips and has an opening positioned at a predetermined location and at least one support surface. The support surface of the chip handler is used for supporting the front surfaces of the plurality of chips when the plurality of chips is mounted to the chip handler. In a particular embodiment, the chip handler has further a cavity that communicates with the opening and has a height higher than heights of the first sets of terminals and the second sets of terminals of the plurality of chips so as to accommodate the first sets of terminals and the second sets of terminals of the plurality of chips inside the cavity when the plurality of chips is mounted to the chip handler. The cavity may be given as a recessed or concave part of a body of the chip handler.

The chip support member is used for supporting the plurality of chips from their back surfaces when the plurality of chips is mounted to the chip support member with the chip handler. The chip support member may be a bonding stage or a bonding head of a chip bonder or other fixture attachable to the bonding stage and head. The bridge handler is used for inserting a bridge member through the opening of the chip handler and for placing the bridge member onto the first sets of terminals of the plurality of chips that are exposed from the opening.

With reference to FIGS. 1A-1D and FIGS. 2A-2D, a schematic of a chip handler used in a manufacturing apparatus of a bridged multichip module according to an embodiment of the present invention is described. The manufacturing apparatus of the bridged multichip module includes an apparatus for interconnecting a plurality of chips by a bridge member.

Specifically, FIGS. 1A-1D describe a chip handler 200 with a bridged module 150 carried by the chip handler 200, while FIGS. 2A-2D describe the chip handler 200 without the bridged module 150 depicted in FIGS. 1A-1D. The chip handler 200 shown in FIGS. 1A-1D and FIG. 2A-2D is a chip handler for interconnecting two chips 100A, 100B by one bridge member 120. However, this is merely an example and the number of chips to be interconnected is not limited and the number of bridge members to be used to interconnect the chips is also not limited. A chip handler, according to embodiments of the present invention, can generally be used for interconnecting two or more chips by using one or more bridge members.

Figure 1C:
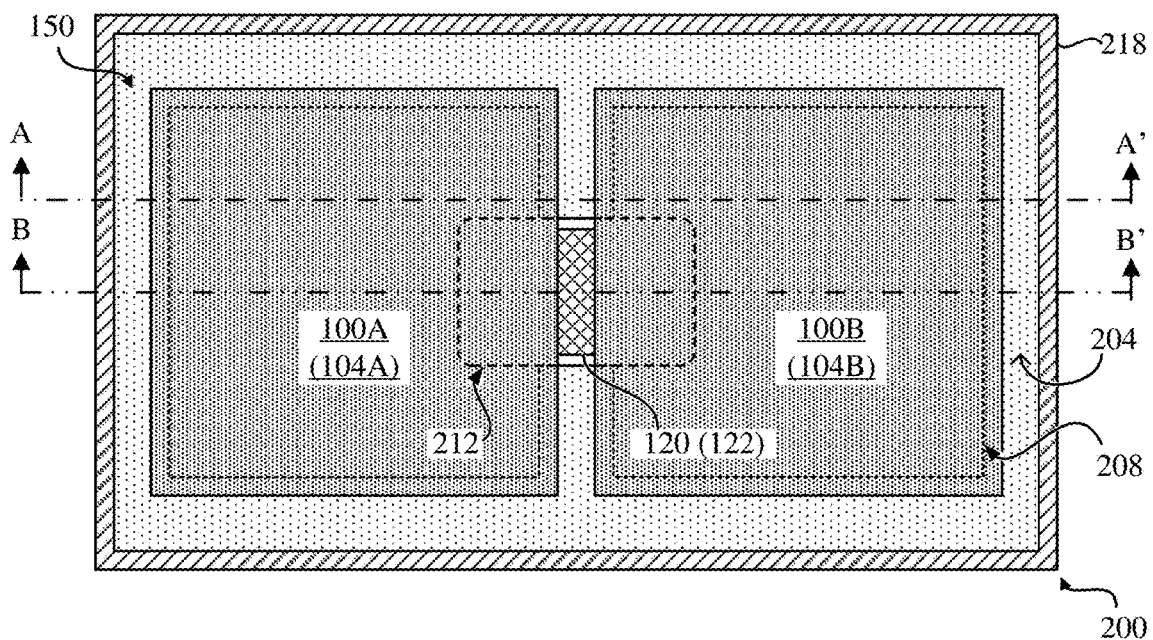
FIG. 1C is a top view of the chip handler, according to an embodiment of the present invention.
Figure 1D:
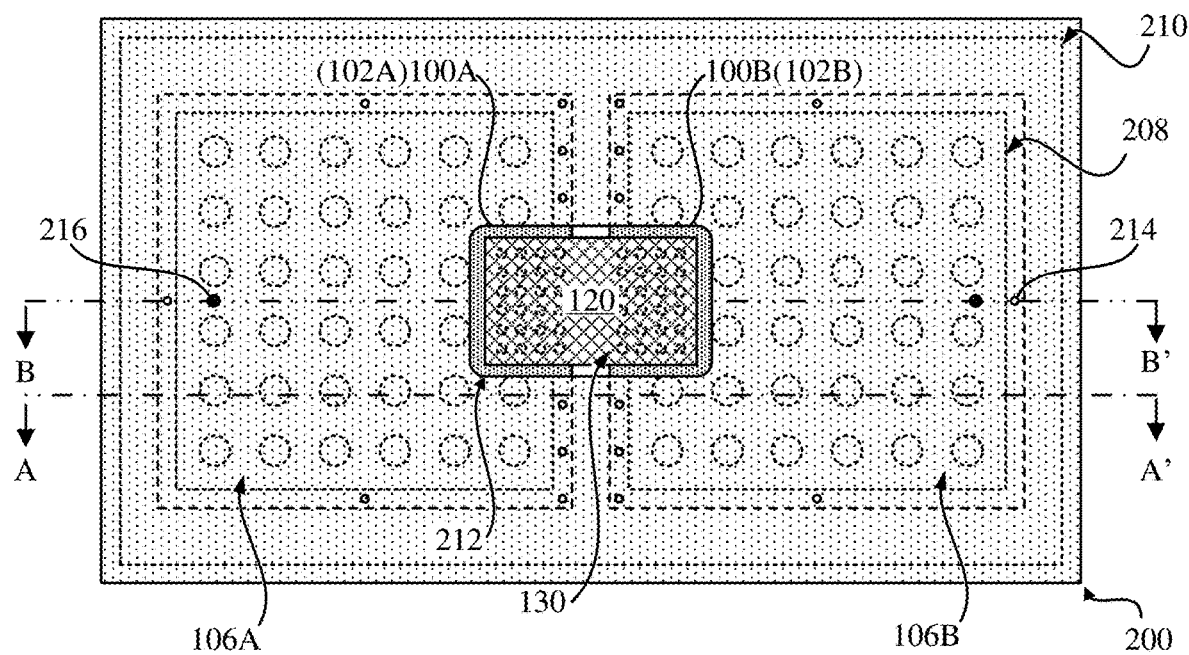
FIG. 1D is a bottom view of the chip handler, according to an embodiment of the present invention.
Figure 2A:
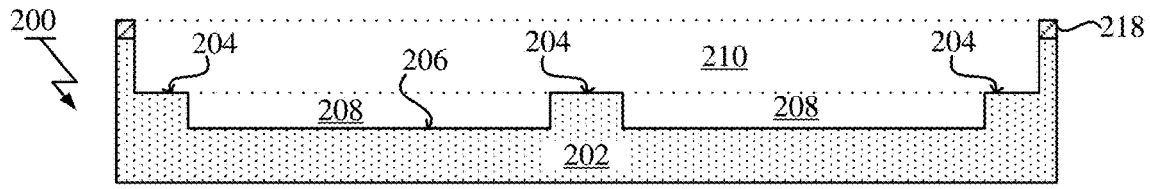
FIG. 2A is a cross-sectional view of a chip handler, according to an embodiment of the present invention.
Figure 2B:
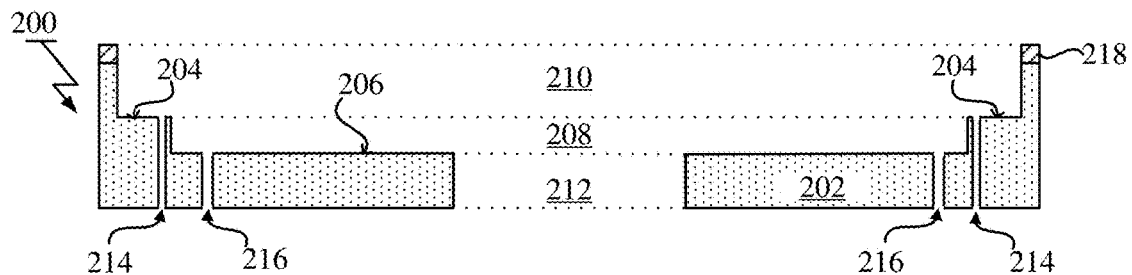
FIG. 2B is a cross-sectional view of the chip handler across line B-B', according to an embodiment of the present invention.
Figure 2C:
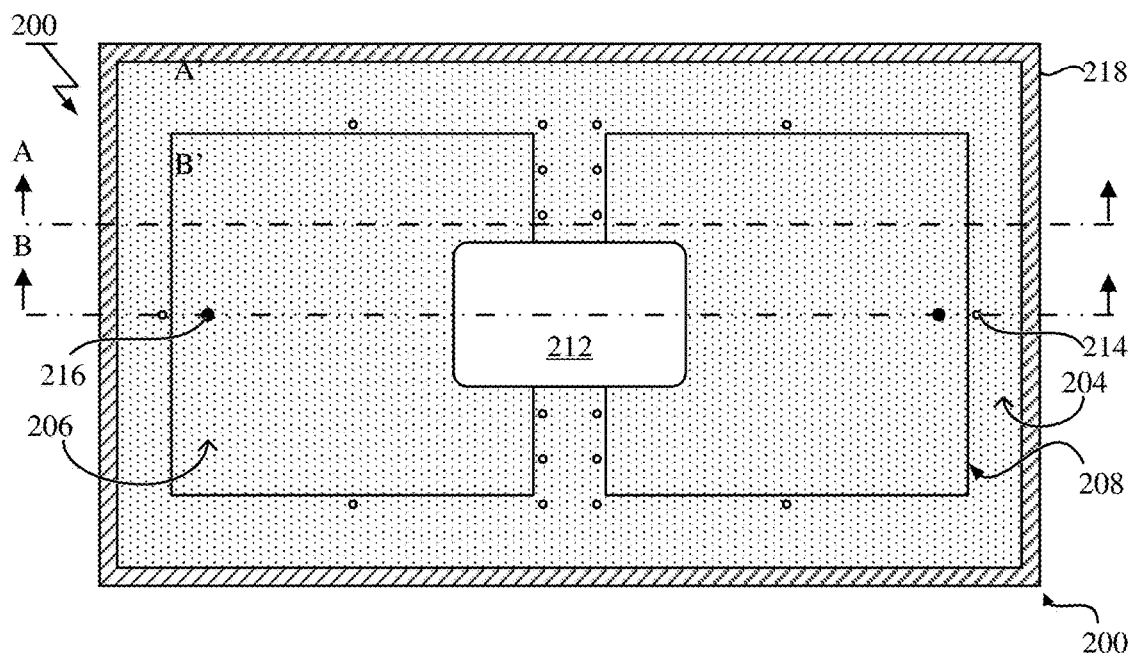
FIG. 2C is a top view of the chip handler, according to an embodiment of the present invention.
Figure 2D:
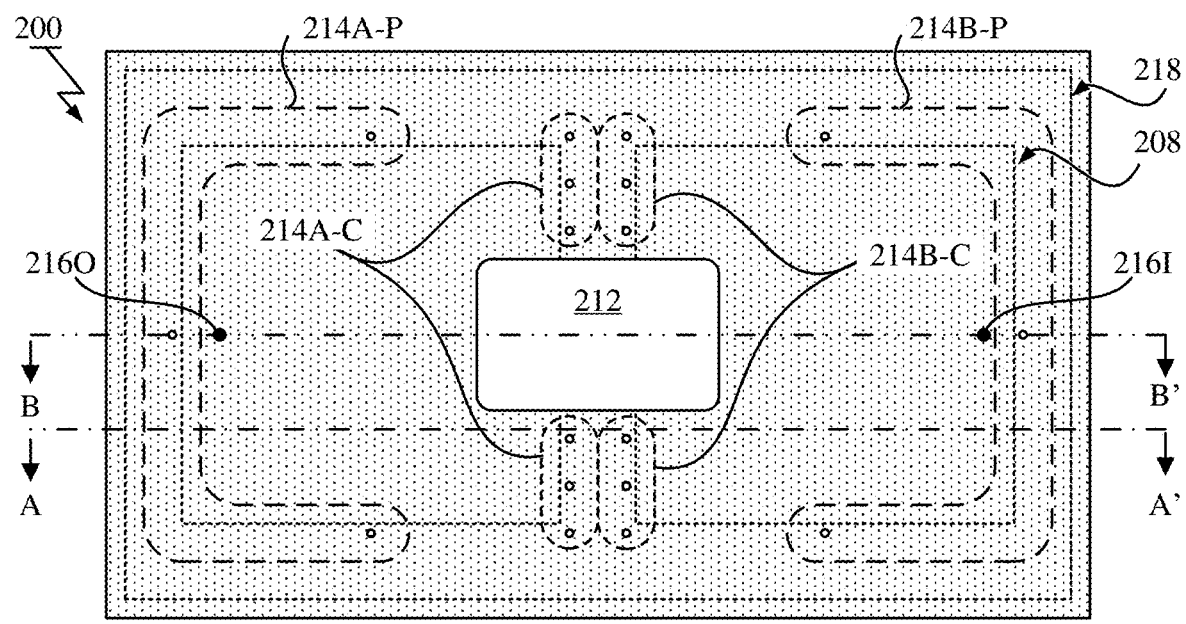
FIG. 2D is a bottom view of the chip handler, according to an embodiment of the present invention.

FIGS. 1A and 1B and FIGS. 2A and 2B show cross-sectional views of the chip handler 200. FIG. 1C and FIG. 2C show top views of the chip handler 200. FIG. 1D and FIG. 2D show bottom views of the chip handler 200. It should be noted that cross-section views shown in FIG. 1A and FIG. 2A correspond to the cross-section denoted by dotted line A-A' shown in the top and bottom views of FIGS. 1C-1D and FIGS. 2C-2D, respectively. The cross-section views shown in FIG. 1B and FIG. 2B correspond to the cross-section denoted by dotted line B-B' in the top and bottom views of FIGS. 1C-1D and FIGS. 2C-2D, respectively.

As shown in FIGS. 1A-1D, the bridged module 150 is carried by the chip handler 200. The bridged module 150 shown in FIGS. 1A-1D is a structure after bridging and includes (two) chips 100A, 100B mounted to the chip handler 200 and one bridge member 120 bonded to the chips 100A, 100B by bridge-chip joints 130. During the manufacturing process of the bridged multichip module, the chip handler 200 is used for handling, carrying, supporting and/or holding two chips, i.e., a first chip 100A and a second chip 100B, as well as intermediate and/or resultant structures of the bridged module 150.

Each chip 100 (a member is referred to by a numeric character with no alphabet character such as "100" when it is collectively referenced, and is referred to by a combination of a numeric character and a corresponding alphabet character such as "100A" and "100B" when it is individually referenced) has a front surface 102 and a back surface 104. The first and second chips 100A, 100B are mounted to the chip handler 200 upside down as shown in FIGS. 1A-1D. The bridge member 120 is bonded to the front surfaces 102A, 102B of the chips 100A, 100B that face down against the chip handler 200.

Each chip 100 may include, but is not limited to, a semiconductor chip (also referred to as "die") containing an integrated circuit. The integrated circuit of each chip 100 may include electric, electro-optic and/or electro-magnetic elements fabricated therein and wirings for connecting these elements to terminals formed at the front surface 102 of the chip 100. Each chip 100 may have functionality of a processor such as a central processing unit (CPU), a digital signal processer (DSP), a GPGPU (General-Purpose Computing on Graphics Processing Units), a memory, an AI accelerator, a SoC (System-on-a-chip), etc. Each chip 100 may be made of a semiconductor material such as Si, SiGe, Ge, GaAs, GaP, InSb, and the like. Such semiconductor materials generally have a low CTE (Coefficient of Thermal Expansion).

The front surface 102 is a chip surface that includes a first set of terminals for bridging (not shown) and a second set of terminals 106 for joining to an external substrate such as an interposer, to which the resultant bridged module 150 would be mounted during a subsequent process. Here, it should be noted that the bridge-chip joints 130 are already formed on the first set of terminals in FIGS. 1A-1D). The terminals may have any suitable form, including a pad (with or without pre-solder), a bump, etc. In the embodiment described in FIGS. 1A-1D, the second set of terminals 106 for joining to the external substrate includes a set of solder bumps and the first set of terminals for bridging may be a set of contact pads. However, these terminals are not limited and, in other embodiment the second set of terminals 106 may be a set of contact pads. Also, the first set of terminals may be a set of bumps.

As shown by dot circles in FIG. 1D, the second set of terminals 106 of each chip 100 forms a two-dimensional array with a notch area and the bridge-chip joints 130 also forms a two-dimensional array located at the notch areas of the two-dimensional array of the second sets of terminals 106A, 106B of the first and second chips 100A, 100B. The notch areas are located at the center of the two chips 100A, 100B.

It should be noted that, in a particular example, each chip 100 may have an area of approximately 10-30 mm×10-30 mm and a thickness of approximately 750-800 micrometers when considering 300 mm wafers, and a thickness of 50 micrometers when considering the back-grinding. Each chip 100 may have bumps with a pitch of approximately 100-200 micrometers and a diameter of approximately 50-100 micrometers.

The bridge member 120 has functionality for interconnecting a plurality of chips (i.e., first chip 100A and the second chip 100B in the exemplary embodiment shown in FIGS. 1A-1D). The bridge member 120 is generally smaller than the chips 100. In the bridged module 150, the bridge member 120 is bonded to both the first and second chips 100A, 100B by the bridge-chip joints 130. The bridge-chip joints 130 may be much smaller than typical C4 bumps. In the bridged module 150, an underfill material may be applied around the bridge-chip joints 130, however, FIGS. 1A-1D show the intermediate structure of the bridged module 150 before underfilling.

For reference, in a particular example, the bridge member 120 may have an area of approximately 1-5 mm×2-10 mm and a thickness of approximately 75-250 micrometers. The bridge member 120 may have micro bumps with a pitch of approximately 20-80 micrometers and a diameter of approximately 10-40 micrometers. The bridge member 120 and the bridged module 150 will be described in more detail below.

The chip handler 200 is used for handling, carrying, supporting and/or holding a first chip 100A and a second chip 100B during the manufacturing process. As shown in FIG. 2A-2D, the chip handler 200 includes a body 202 that has a first cavity 210, a second cavity 208 formed at the bottom of the first cavity 210 and an opening 212 formed through the body 202. The cavities 208, 210 may be given as a recessed or concave part of the body 202 of the chip handler 200. The first cavity 210 connects to the second cavity 208 and the second cavity 208 communicates with the opening 212. The bottom of the second cavity 208 corresponds to a bottom surface 206 and the bottom of the first cavity 210 corresponds to a surface 204.

As shown in FIGS. 1A-1D, the surface 204 supports the front surfaces 102A, 102B of the first and second chips 100A, 100B at a peripheral region of each chip 100 when the first and second chips 100A, 100B are mounted to the chip handler 200. Thus, the surface 204 is often referred to as a "support surface", hereinbelow. In the exemplary embodiment shown in FIGS. 1A-1D and FIGS. 2A-2D, the support surface 204 is one flat continuous surface. However, in other embodiments, the support surface 204 may include a plurality of surface regions separated from each other. For instance, there may be an additional support surface located at a central region of each chip 100. Hence, the chip handler 200 has at least one support surface 204 for supporting the front surfaces 102A, 102B of the first chip 100A and the second chip 100B when the first and second chips 100A, 100B are mounted to the chip handler 200.

The first chip 100A and the second chip 100B are mounted to the chip handler 200 and aligned against the chip handler 200 horizontally by using an appropriate alignment tool. When the first chip 100A and the second chip 100B are aligned against the chip handler 200 horizontally and mounted to the chip handler 200, the support surface 204 of the chip handler 200 contacts the front surfaces 102A, 102B of the first and second chips 100A, 100B at their peripheral regions. Thereby, the vertical alignment between the front surface 102A of the first chip 100A and the front surface 102B of the second chip 100B are also established.

As shown in FIGS. 1A-1D, the second cavity 208 shown in FIGS. 2A-2D has a height higher than heights of the first sets of terminals and the second sets of terminals so as to accommodate the first sets of terminals and the second sets of terminals 106A, 106B of the first and second chips 100A, 100B inside the cavity 208 when the first and second chips 100A, 100B are mounted to the chip handler 200. It should be noted that the edge of the second cavity 208 is represented by short-dashed lines in the top and bottom views of FIGS. 1C and 1D. The edge of the first cavity 210 is represented by a short-dashed line in the bottom view of FIG. 1D. Also, the edge of each chip 100 is represented by a dashed line in the bottom view of FIG. 1D. The first cavity 210 accommodates the body of the first and second chips 100A, 100B when the first and second chips 100A, 100B are mounted to the chip handler 200.

It should also be noted that when the first and second chips 100A, 100B are mounted to the chip handler 200 by the support surface 204, the back surfaces 104A, 104B of the chips 100A, 100B are exposed from the body 202 of the chip handler 200. Also, in the described embodiment, the chips 100A, 100B are completely contained in the cavities 208, 210 of the chip handler 200.

As described above, the chip handler 200 also has the opening 212, through which the bridge member 120 is inserted and placed onto the first and second chips 100A, 100B. For this purpose, the opening 212 is positioned at a predetermined location where the bridge member 120 is to be placed, as shown in FIG. 1D. It should be noted that a portion of the edge of the opening 212 behind the chips 100A, 100B is represented by a dashed line in the top view of FIG. 1C.

The chip handler 200 may further include a gas sealing member 218 provided on a top of the body 202 of the chip handler 200 for sealing a space inside the body 202 when the chip handler 200 with the chips 100A, 100B is assembled to a chip support member, which will be described below. Example of the gas sealing member 218 may include, but is not limited to, rubber, silicone, fiberglass, plastic polymer, and the like.

As shown in FIG. 1C, when viewed from the top, the bridge member 120 (a front surface 122 thereof) can be seen through a gap between the first and second chips 100A, 100B. Also as shown in FIG. 1D, when viewed from the bottom, the bridge member 120 (a back surface 124 thereof) bonded to the first and second chips 100A, 100B and parts of the front surfaces 102A, 102B of the first and second chips 100A, 100B can be seen through the opening 212.

According to an embodiment, the chip handler 200 may include a fixing mechanism for fixing the first and second chips 100A, 100B to the support surface 204. As a part of the fixing mechanism, the chip handler 200 has a set of holes 214 formed on the support surface 204 as shown more clearly in FIGS. 2C and 2D. The set of holes 214 is connected to suction (or vacuum) lines in an appropriate manner and used for sucking the front surfaces 102A, 102B of the chips 100A, 100B. The holes 214 are opened at points corresponding to the peripheral regions of the chips 100A, 100B, which are outside areas of the bridge-chip joints 130 and the second sets of terminals 106A, 106B. As reference, in an embodiment, there is a peripheral region for each chip 100 with several hundred micrometers width. The holes 214 may be fabricated at such edge regions of the chips 100A, 100B.

The set of holes 214 may be divided into two subsets: a first subset of holes 214A for first chip 100A and a second subset of holes 214B for second chip 100B. The holes 214 may be distributed apart from each other as shown in FIGS. 2C and 2D. In a particular embodiment, the holes 214 may be evenly distributed. In a preferred embodiment, the set of holes 214 may be divided into at least two subsets: a peripheral subset of holes 214 (denoted as 214A-P, 214B-P) that are sparsely distributed and a central subset of holes 214 (denoted as 214A-C, 214B-C) that are densely distributed than the peripheral subsets. The number of holes located at the handler center are preferably more than the number of holes located at handler peripheral so as to eliminate improper displacement of terminals on first and second chips 100A, 100B during heating if the CTE mismatch between the chip 100 and the chip handler 200 is not small enough.

According to an embodiment, the chip handler 200 may further include a gas supply mechanism for supplying gas into the space inside the body 202 (including at least the cavity 208) when the chip handler 200 with the chips 100A, 100B is assembled to the chip support member. The body 202 of the chip handler 200 functions as a gas flow container when the gas sealing member 218 touches the surface of the chip support member. As a part of the gas supplying mechanism, the chip handler 200 has a gas inlet 2161 and a gas outlet 2160 that are opened at the body 202 of the chip handler 200 and communicate with the space inside the body 202, as shown in FIGS. 1B, 1D and FIGS. 2B-2D.

In a particular embodiment, the gas to be supplied from the gas inlet 2161 may include reduction gas for cleaning the terminals of the chips 100A, 100B and/or the bridge member 120 accommodated inside the space. Examples of the reduction gas include a gas-phase formic acid, a hydrogen gas (hydrogen and inert gas (e.g., nitrogen, argon) mixture), and the like. The gas-phase formic acid can remove the metal oxide formed on the terminals, preferably. The gas to be supplied from the gas inlet 2161 may also include an inert gas, including a nitrogen gas, a noble gas such as argon, and the like. The inert gas may be used for displacing the gas inside the space after the bridging.

The body 202 of the chip handler 200 may be made of any material such as silicon, metal (e.g., pure metal and alloy), ceramic, etc. For its purpose, the material of the body 202 may have certain degree of rigidity. In a preferred embodiment, the body 202 of the chip handler 200 may be made of any material having a certain CTE (Coefficient of Thermal Expansion) similar to or comparable to the material of the chips 100A, 100B. In a preferred embodiment, the body 202 of the chip handler 200 may be made of any material having at least one of, more preferably all of, heat resistance, machinability, and anti-corrosion property against the reduction gas such as a gas-phase formic acid. Examples of such materials suitable for the body 202 of the chip handler 200 may include Mo, Ti, Zr, Hastelloy™ (Ni, Mo, Cr), and the like. In a particular embodiment, a pure metal and alloy other than SUS (Fe, Cr, Ni), Al alloy may be used for the body 202 of the chip handler 200.

With reference to FIGS. 3A-3E and FIGS. 4A-4E, a schematic of a process for manufacturing a bridged multichip module using a chip handler is shown, according to an embodiment of the present invention. The manufacturing process of the bridged multichip module includes a process for interconnecting a plurality of chips by a bridge member by using the chip handler. In this embodiment, FIGS. 3A-3E and FIGS. 4A-4E show cross-section views corresponding to the cross-section denoted by line B-B' in the top and bottom views of FIGS. 1C-1D and FIGS. 2C-2D. However, the cross-sectional portion along with the A-A' line, including the central portion of the support surface 204 that is in contact with the two chips 100A, 100B, is also depicted by dotted lines in FIGS. 3A-3E and FIGS. 4A-4E.

Figure 3A:
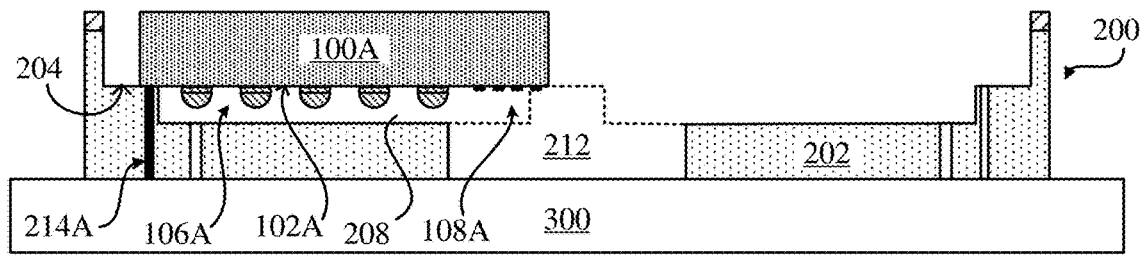
FIG. 3A illustrates a first step of a process for manufacturing a bridged multichip module using a chip handler, according to an embodiment of the present invention.

As shown in FIG. 3A, the manufacturing process may include a step of mounting, to the chip handler 200, a first chip 100A with an alignment mark (not shown) by using a bonding head, followed by sucking a front surface 102A of the first chip 100A by a first subset of holes 214A that are formed on a support surface 204 of the chip handler 200. The alignment mark of the chip handler side can be formed on the surfaces 204,206A of the chip handler 200. The alignment mark of the chip side can be formed on the front surface 102A (the same holds for the second chip 100B)

where the terminals are fabricated, thereby enabling high precision alignment. The chip handler 200 is placed on a bonding stage 300 of a chip bonder. It should be noted that in FIGS. 3A-3E and FIGS. 4A-4E, a solid bold line represents a hole (and a channel) where the vacuum (including depressurization) is currently turned on. The first chip 100A is mounted to the chip handler 200 upside down. The first set of terminals 108A for bridging and the second set of terminals 106A of the first chip 100A are accommodated in the cavity 208 of the chip handler 200.

Figure 3B:
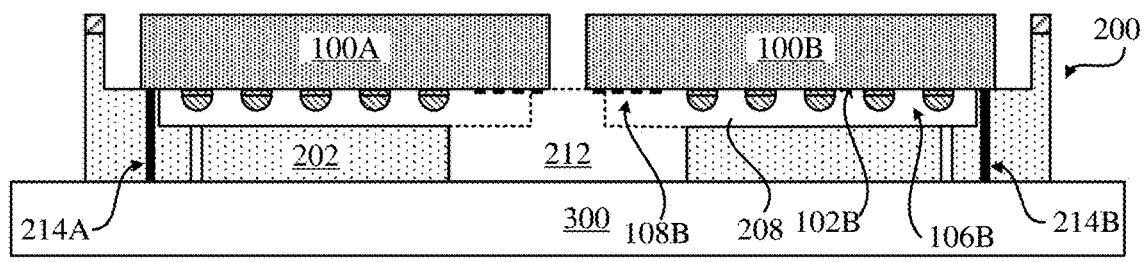
FIG. 3B is a cross-sectional view of the chip handler depicting a mounting step, according to an embodiment of the present invention.

As shown in FIG. 3B, the manufacturing process may also include a step of mounting, to the chip handler 200, a second chip 100B with an alignment mark (not shown) by using the bonding head, followed by sucking a front surface 102B of the second chip 100B by holes 214B formed on the support surface 204 of the chip handler 200. The second chip 100B is also mounted to the chip handler 200 upside down. The first set of terminals 108B and the second set of terminals 106B of the second chip 100B are accommodated in the cavity 208 of the chip handler 200.

By performing the steps shown in FIGS. 3A-3B, the first chip 100A and the second chip 100B are mounted to the chip handler 200 so that the front surfaces 102A, 102B of the chips 100A, 100B are supported by the support surface 204 of the chip handler 200. Hence, the front surfaces 102A, 102B of the first and second chips 100A, 100B are vertically aligned. It should be noted that aligning two surfaces vertically means that the two surfaces are flush or aligned with a difference allowable for bridge-chip joining.

Figure 3C:
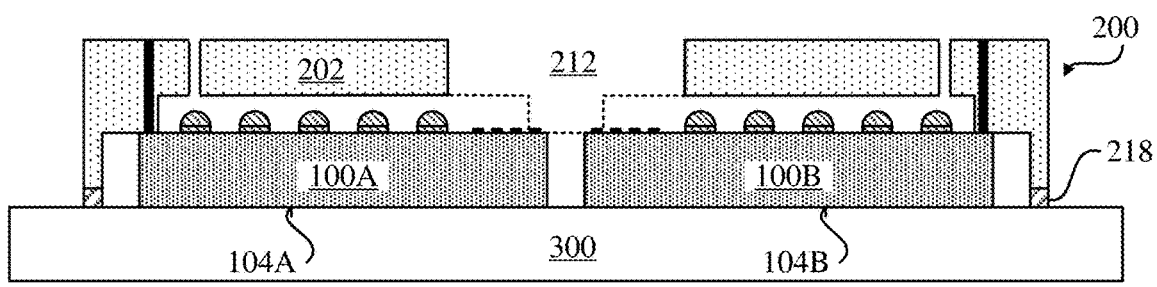
FIG. 3C is a cross-sectional view of the chip handler depicting the step of placing a first chip and a second chip on a bonding stage, according to an embodiment of the present invention.

As shown in FIG. 3C, the manufacturing process may also include a step of placing the first chip 100A and the second chip 100B on a bonding stage 300 from their back surfaces 104A, 104B. The placing step may include a step of flipping the first and second chips 100A, 100B down on the bonding stage 300 by reversing the chip handler 200. The bonding stage 300 works as a chip support member in the described embodiment.

Figure 3D:
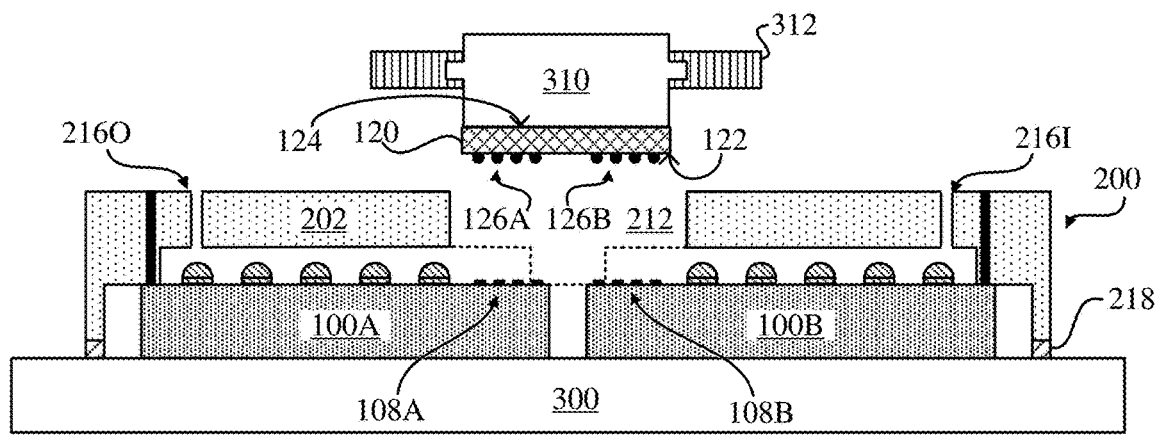
FIG. 3D is a cross-sectional view of the chip handler depicting the step of preparing a bridge member attached to a bridge handler, according to an embodiment of the present invention.

As shown in FIG. 3D, the manufacturing process may further include a step of preparing a bridge member 120 attached to a bridge handler 310. The bridge handler 310 includes a (handler) body for attaching the bridge member 120 and a gas leakage stopper 312 attached to the bridge handler 310. In the described embodiment, the bridge handler 310 may be attached to a bonding head of the chip bonder. The gas leakage stopper 312 is used for closing the opening 212 of the chip handler 200 so as to seal a chamber space 350 formed by the chip handler 200 and the bonding stage 300 when the bridge member 120 is inserted through the opening 212 of the chip handler 200 by the handler body. The handler body of the bridge handler 310 may have protrusions to which the gas leakage stopper 312 is fixed, as shown in the figure. Examples of the material used for the handler body of the bridge handler 310 may include, but is not limited to, aluminum nitride, and materials thereof. Example of the gas leakage stopper 312 may include, but is not limited to, rubber, silicone, and the like.

The bridge member 120 may include, but is not limited to, a semiconductor chip or organic member having interconnections fabricated therein. The bridge member 120 may have the functionality of interconnecting each terminal formed on one side, which would be bound to one chip, to a corresponding terminal formed on another side, which would also be bounded to another chip.

In a particular embodiment, the bridge member 120 may be made of a semiconductor material such as Si, SiGe, Ge, GaAs, GaP, InSb, and the like, hence, the bridge member is a bridge chip. In other particular embodiment, the bridge member 120 may be made of an organic material and a conductive pattern. Examples of the organic material used for the organic bridge member may include any thermosetting or thermoplastic polymer material such as epoxy resin, acrylic resin, photosensitive insulating resins such as PI (polyimide), BCB (benzocyclobutene), polybenzoxazole (PBO), and the like. The conductive pattern embedded in the organic material may be any one of metal materials (e.g., Cu, Al, etc.) and other conductive materials.

The bridge member 120 may also have a front surface 122 and a back surface 124 opposite to the front surface 122. The front surface 122 is a surface where third sets of terminals 126A, 126B for bridging are formed. In the embodiment described in FIG. 3C, the thirds set of terminals 126 for bridging may be a set of (micro) bumps. The set of bumps included in the thirds set of terminals 126 may be divided into two subsets, including a first subset of terminals 126A to join to the first chip 100A and a second subset of terminals 126B to join to the second chip 100B. The bridge member 120 may be supported by the handler body of the bridge handler 310 from the back surface 124.

Figure 3E:
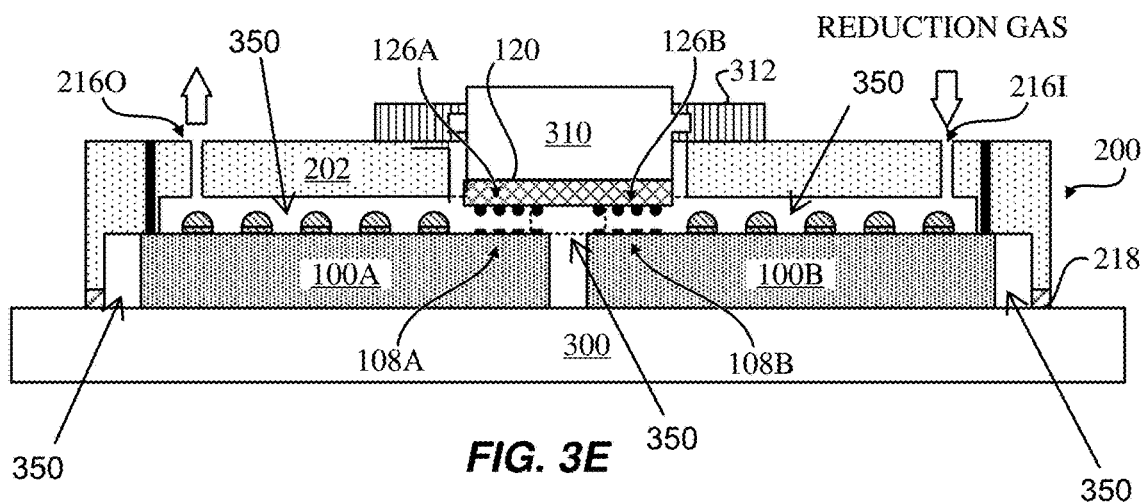
FIG. 3E is a cross-sectional view of the chip handler depicting the step of inserting the bridge member by the bridge handler through the opening of the chip handler, according to an embodiment of the present invention.

As shown in FIG. 3E, the manufacturing process may also include a step of inserting the bridge member 120 by the bridge handler 310 through the opening 212 of the chip handler 200 with an alignment mark (not shown) so as to place the bridge member 120 onto the first sets of terminals 108A, 108B of the chips 100A, 100B. The alignment marks may be formed on the front surface 102 of the chip 100 and the front surface 122 of the bridge member 120 where the terminals are fabricated, thereby enabling high precision alignment. The bridge member 120 is inserted so that the aligned front surfaces 102A, 102B of the chips 100A, 100B and the front surface 122 of the bridge member 120 face each other. Also, the first set of terminals 108A of the first chip 100A is aligned to the first subset of terminals 126A of the bridge member 120. The first set of terminals 108B of the second chip 100B is aligned to the second subset of terminals 126B of the bridge member 120. During the inserting step, the gas leakage stopper 312 touches on the top of the chip handler 200 to cover the gap between the bridge handler 310 and the chip handler 200.

As also shown in FIG. 3E, the manufacturing process may further include a step of suppling reduction gas into the chamber space 350 to clean the terminals 108A, 108B of the first chip 100A and the second chip 100B and/or the terminals 126A, 126B of the bridge member 120. Oxide metal formed at the terminals can be removed by the reduction gas. Examples of the reduction gas may include a gas-phase formic acid (e.g., a mixture of a gas phase formic acid and a nitrogen gas with an appropriate ratio), hydrogen (e.g., hydrogen and an inert gas (e.g., nitrogen, argon, etc.) mixture), and the like. During the step of the inserting, the chip handler 200, the bonding stage 300 and the bridge handler with the gas leakage stopper 312 are assembled to provide the chamber space 350, which is preferably a closed space. The chamber space 350 may accommodate the first sets of terminals 108A, 108B of the first and second chips 100A, 100B and terminals 126A, 126B of the bridge member 120 inside the chamber space 350.

Figure 4A:
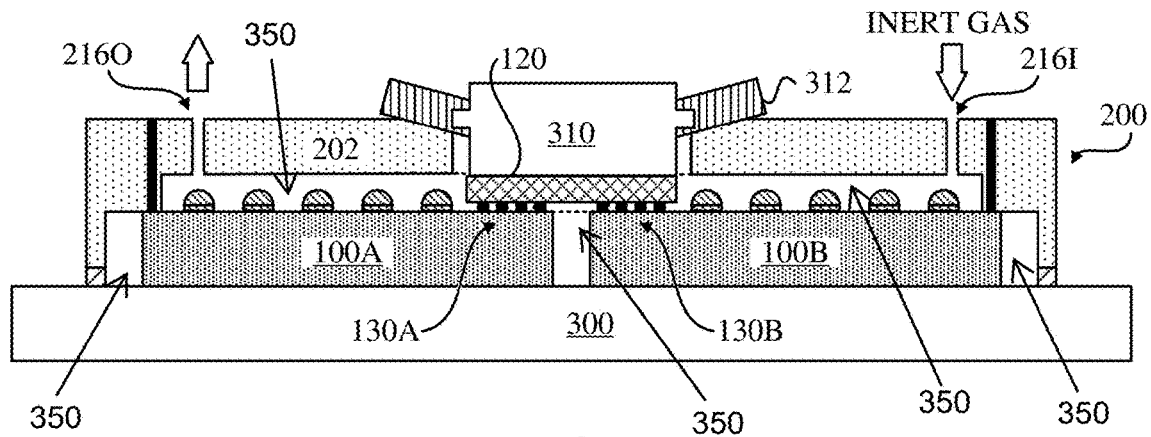
FIG. 4A is a cross-sectional view of the chip handler depicting the steps of elevating a temperature, performing solder joining, displacing gas by an inert gas and cooling down, according to an embodiment of the present invention.

As shown in FIG. 4A, the manufacturing process may also include a step of elevating the temperature, a step of performing solder joining, a step of displacing gas by inert gas and a step of cooling down. By performing the solder joining, a first subset of bridge-chip joints 130A and a second subset of bridge-chip joints 130B are formed between the bridge member 120 and the chips 100A, 100B, respectively. In the described embodiment, flip chip bonding is performed in the reduction gas environment. Hence, cleaning-less joining in reducing atmosphere can be achieved. Also, since the reduction gas can be retained in the chamber space 350, the corrosion of the apparatus parts outside the chamber space 350 due to the corrosive nature of the gas can also be prevented.

Figure 4B:
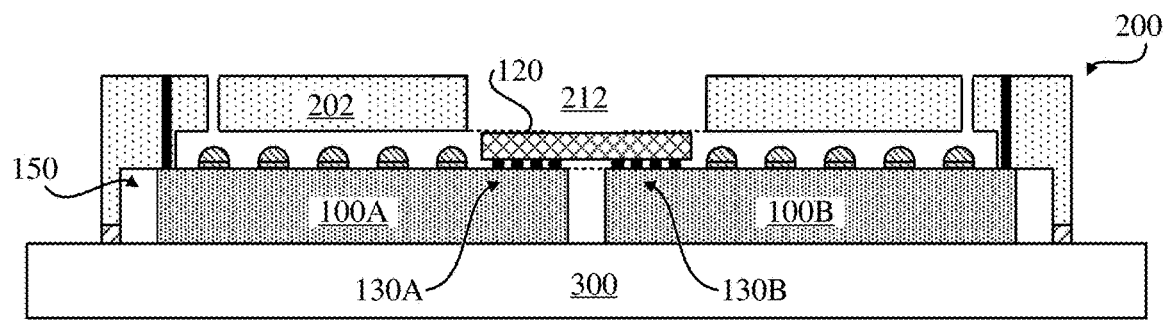
FIG. 4B is a cross-sectional view of the chip handler depicting the steps of releasing the bonded bridge member and pulling the handler body of the bridge handler out of the chip handler, according to an embodiment of the present invention.

As shown in FIG. 4B, the manufacturing process may include a step of releasing the bonded bridge member 120 from the handler body of the bridge handler 310 and a step of pulling the handler body of the bridge handler 310 out of the chip handler 200 through the opening 212, which leaves a bridged module 150 between the chip handler 200 and the bonding stage 300.

Figure 4C:
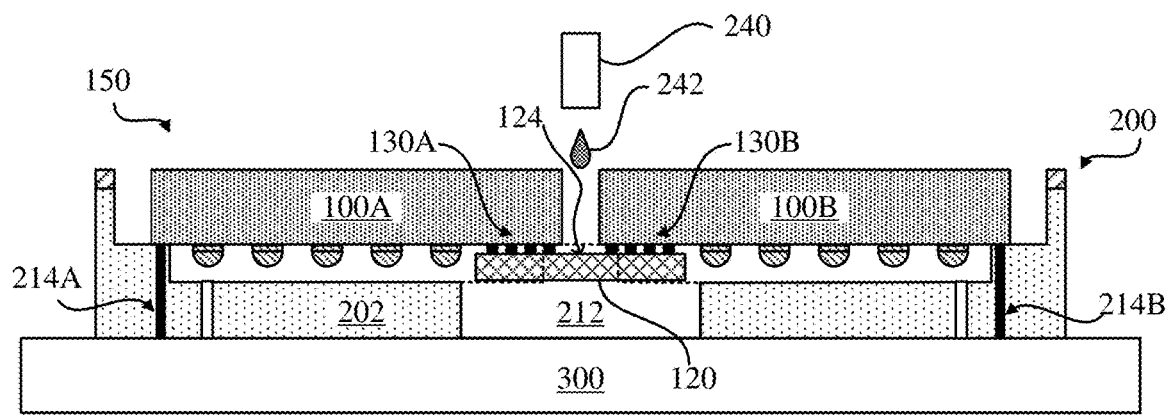
FIG. 4C is a cross-sectional view of the chip handler depicting the step of dispensing an underfill material, according to an embodiment of the present invention.

As shown in FIG. 4C, the manufacturing process may further include a step of dispensing an underfill material, from a side of the back surfaces 104A, 104B of the chips 100A, 100B, to a place around the bridge-chip joints 130A, 130B. Note that the chip handler 200 and the bridged module 150 are flipped when comparing with FIG. 4B. In a preferred embodiment, a jet dispenser 240 may be used to inject droplets 242 of the underfill material through a gap between the chips 100A, 100B. This gap generally may range from 150 to 450 micrometers. Hence, the jet dispenser that can inject droplets 242 having a size less than the size of typical needles used for capillary underfilling may be preferably employed. In a preferred embodiment, before dispensing an underfill material, plasma treatment may be conducted. Since the underfill material can be applied after the bridging, normal capillary-type underfill having better material properties (e.g., higher adhesivity) in comparison with NCP (Non-Conductive Paste) can be employed, which reduces a risk of defect of joints.

Figure 4D:
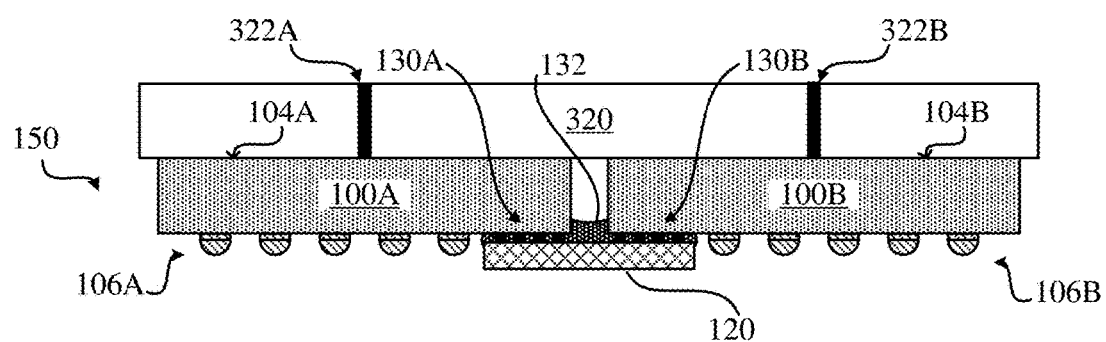
FIG. 4D is a cross-sectional view of the chip handler depicting the step of releasing the bridged module from the chip handler, according to an embodiment of the present invention.

As shown in FIG. 4D, the manufacturing process may also include a step of releasing the bridged module 150 from the chip handler 200 by turning off the suction of the holes 214 and picking up the bridged module 150 from the chip handler 200 by a bonding head 320. The bonding head 320 may have a set of holes 322A, 322B for sucking the back surfaces 104A, 104B of the chips 100A, 100B. The process may also include a step of curing the dispensed an underfill material 132 in an oven.

Figure 4E:
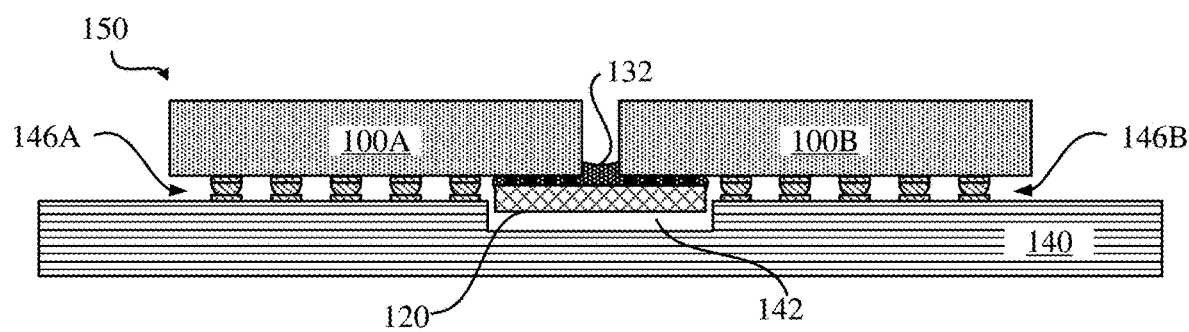
FIG. 4E is a cross-sectional view of the chip handler depicting the step of mounting the bridged module on a substrate, according to an embodiment of the present invention.

As shown in FIG. 4E, the manufacturing process may also include a step of mounting the bridged module 150 on a substrate 140 such as an interposer followed by performing reflow. The substrate 140 may have a recess or cavity 142 to avoid interference between the bridge member 120 and the substrate 140. By performing the reflow, a first subset of joints 142A and a second subset of joints 142B are formed between the chips 100A, 100B and the substrate 140, respectively. After the reflow step, any appropriate packaging process may be conducted to manufacture the final bridged multichip module.

Figure 5:
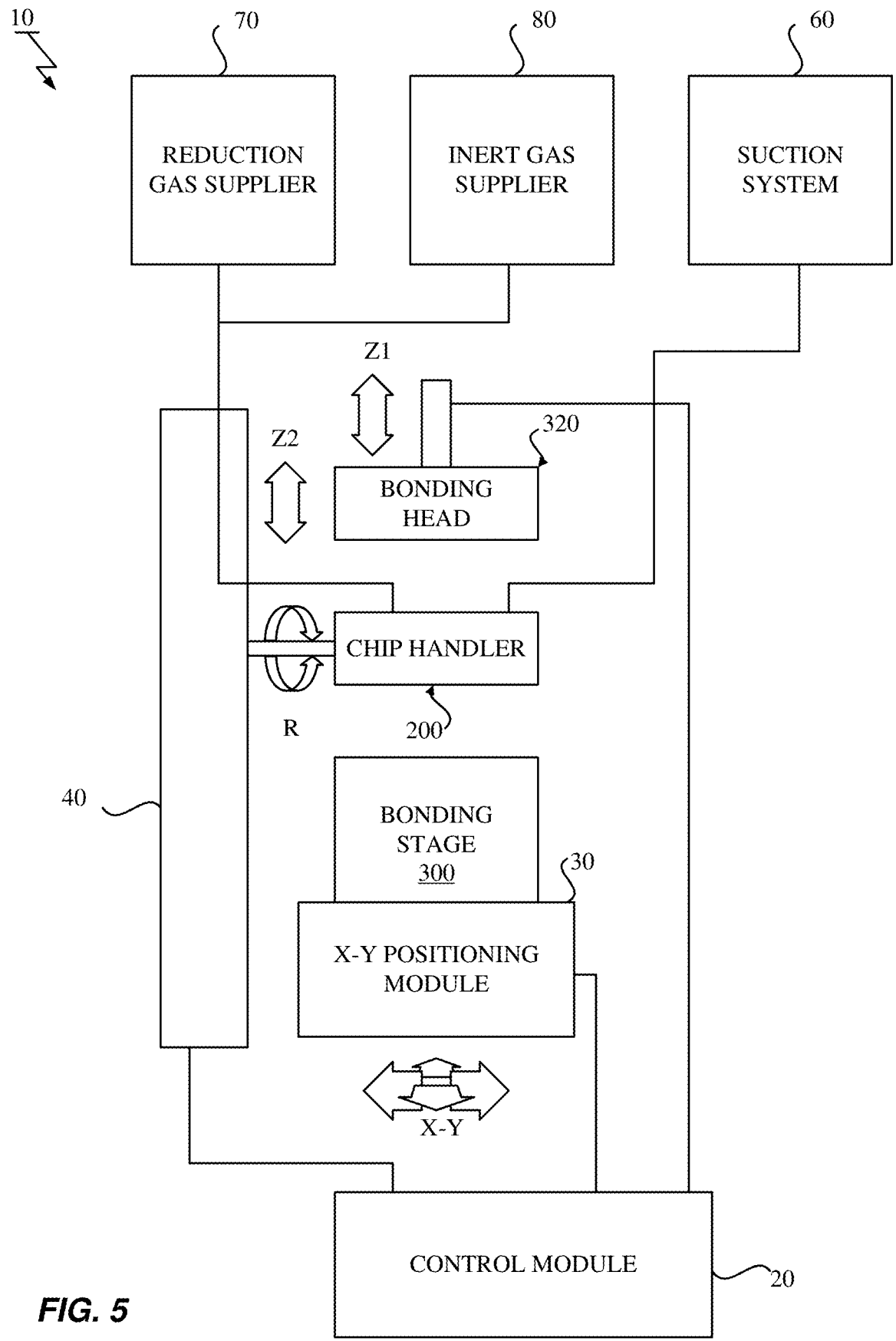
FIG. 5 illustrates a schematic of a manufacturing apparatus of a bridged multichip module, according to an embodiment of the present invention.

With reference to FIG. 5, a schematic of a manufacturing apparatus 10 of a bridged multichip module is shown, according to an embodiment of the present invention. As shown in FIG. 5, the manufacturing apparatus 10 includes the bonding stage 300, the chip handler 200 and the bonding head 320, which are described above. The manufacturing apparatus 10 further includes a control module 20, an XY-positioning module 30, a Z positioning module 40, and a suction system 60, a reduction gas supplier 70 and an inert gas supplier 80.

The bonding stage 300 is used for supporting a thing or object placed thereon. The bonding stage 300 is attached to the XY-positioning module 30, which is used for positioning the bonding stage 300 in X-Y dimensions (horizontal directions). The XY-positioning module 30 is used for aligning the plurality of chips 100 against the chip handler 200 horizontally when the chip handler 200 is placed on the bonding stage 300 as shown in FIGS. 3A-3B. The bonding stage 300 can also be used for supporting the plurality of chips 100 from their back surfaces 104 and can work as a chip support member, as shown in FIGS. 3C-3E and FIGS. 4A-4B.

The chip handler 200 is used for handling, carrying, supporting and/or holding a plurality of chips 100 during the manufacturing process. The chip handler 200 is rotatably attached to the Z positioning module 40, which is used for positioning the chip handler 200 in a Z dimension (Z1, vertical direction). The Z positioning module 40 can flip the chip handler 200 down and up if necessary.

The bonding head 320 is used for handling the bridged module 150. The bonding head 320 may be attached to any Z positioning means, which is used for positioning the bonding head 320 in a Z dimension (Z2, vertical direction). The bridge handler 310 used for inserting the bridge member 120 may also be attached to the bonding head 320.

The suction system 60 is used for sucking the front surfaces 102 of the chips 100 from the holes 214 formed to the chip handler 200. The suction system 60 may include a vacuum pump, vacuum piping connected to the channels of the chip handler 200 and the vacuum pump and valves for controlling the flow of gas.

The reduction gas supplier 70 is used for suppling reduction gas into the chamber space 350 inside the chip handler 200. In embodiments in which the gas phase formic acid is employed, the reduction gas supplier 70 may include a tank for retaining formic acid, a heating chamber for vaporizing the formic acid, a gas flow piping connected to the inlet 2161 of the chip handler 200 and the heating chamber, and valves for controlling the flow of gas. In embodiments in which a hydrogen gas (hydrogen and inert gas (e.g., nitrogen, argon) mixture) is employed, the reduction gas supplier 70 may include a gas cylinder for suppling the hydrogen gas into the chamber space 350 inside the chip handler 200.

The inert gas supplier 80 is used for suppling inert gas into the chamber space 350 inside the chip handler 200 to replace the reduction gas remaining in the chamber space 350. The inert gas supplier 80 may include a gas cylinder for supplying gas, gas flow piping connected to the inlets 2161 of the chip handler 200 and the cylinder and valves for controlling the flow of gas. The inert gas supplier 80 may also be used for suppling inert gas to mix with the reduction gas.

The manufacturing apparatus 10 may further include the jet dispenser 240 for dispensing the underfill material, which is shown in FIG. 4C and is omitted in FIG. 5. Also, the manufacturing apparatus 10 may further include the bridge handler 310 used for inserting the bridge member 120, which is shown in FIGS. 3D-3E and FIG. 4A and is omitted in FIG. 5.

The control module 20 may include processing circuitry and electronic components and operates the XY-positioning module 30, the Z positioning module 40, the bonding head 320, the suction system 60, the reduction gas supplier 70, the inert gas supplier 80 and the jet dispenser 240. The control module 20 controls any one of the step of mounting the chips 100 to the chip handler 200, the step of flipping the chip handler 200, the steps of handling the bridge member, the step of dispensing the underfill material, the step of releasing the bridged module 150 from the chip handler 200 and the step of mounting the bridged module 150 to the substrate 140 shown in FIGS. 3A-3E and FIGS. 4A-4E.

Although the bonding stage 300 is described as moving along the XY directions and the chip handler 200 and the bonding head 320 are described as moving along the z direction, any configuration may be employed as long as the relative positions of the handlers or the head (200, 310, 320) with respect to the bonding stage 500 are three-dimensionally determined.

Figure 6A:
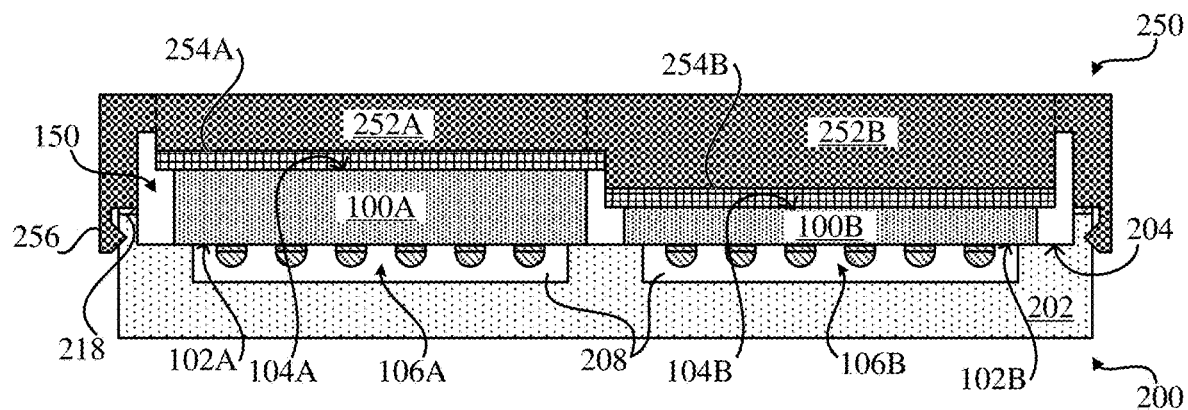
FIG. 6A is a cross sectional view of a chip handler, a chip support member and a bridged module mounted to the chip handler and the chip support member used in a manufacturing apparatus of a bridged multichip module, according to an embodiment of the present invention.
Figure 6B:
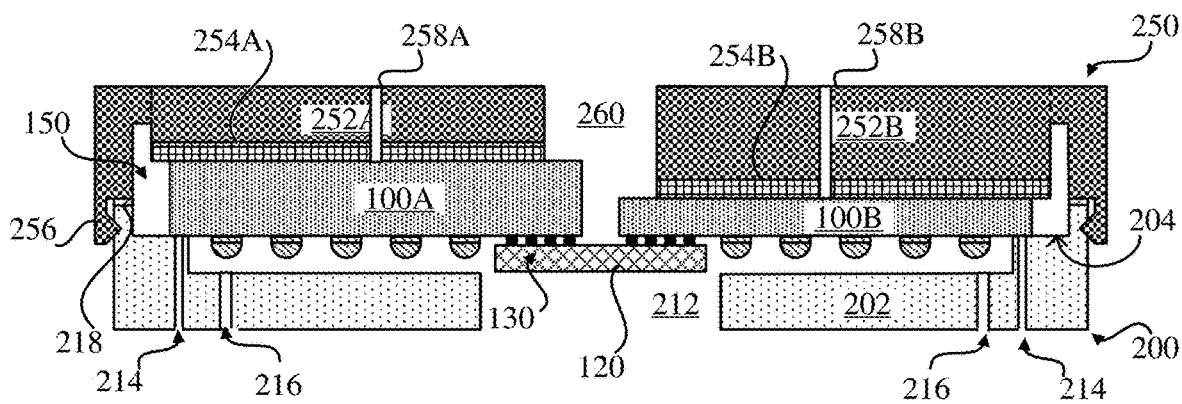
FIG. 6B is a cross-sectional view of an assemble of the chip handler and the chip support member across line B-B', according to an embodiment of the present invention.
Figure 6C:
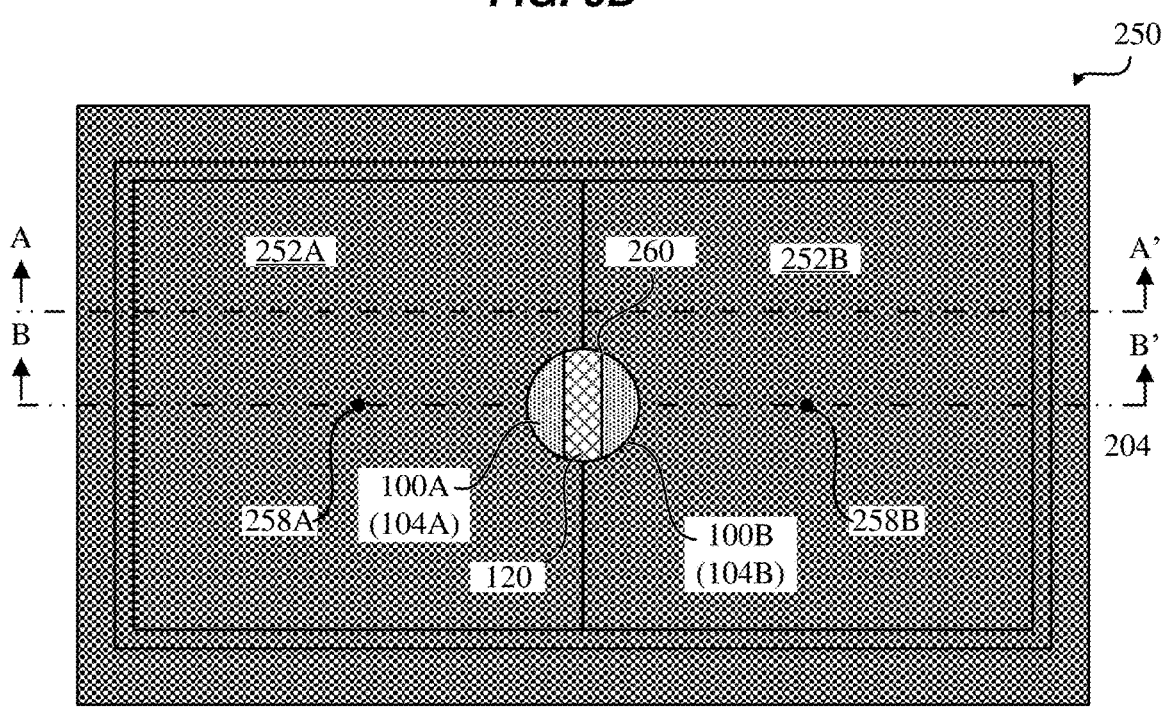
FIG. 6C is a top view of the assemble of the chip handler, according to an embodiment of the present invention.

With reference to FIGS. 6A-6C, a schematic of a chip handler, a chip support member, and a bridged module mounted to the chip handler and the chip support member used in a manufacturing apparatus of a bridged multichip module is shown, according to an embodiment of the present invention. The manufacturing apparatus of the bridged multichip module includes an apparatus for interconnecting a plurality of chips by a bridge member by using the chip handler and the chip support member.

The exemplary embodiment described with reference to FIGS. 1A-1D, FIGS. 2A-2D, FIGS. 3A-3E, FIGS. 4A-4E and FIG. 5 is preferably used for interconnecting a plurality of chips 100 having almost the same thickness. The exemplary embodiment shown in FIGS. 6A-6C is preferably used for interconnecting a plurality of chips having difference thickness.

FIGS. 6A-6C describe a chip handler 200 and a chip support member 250 with a bridged module 150 carried by them. The chip handler 200 shown in FIGS. 6A-6C has almost the same structure as the chip handler 200 shown in FIGS. 1A-1D and FIGS. 2A-2D, unless otherwise noted.

FIGS. 6A and 6B show cross-sectional views of an assemble of the chip handler 200 and the chip support member 250. FIG. 0.6C shows a top view of the assemble of the chip handler 200 and the chip support member 250. Note that cross-section views shown in FIGS. 6A and 6B correspond to the cross-sections denoted by lines A-A' and B-B' shown in the top views of FIGS. 6C, respectively.

As shown in FIGS. 6A-6C, the bridged module 150 is carried by the assemble of the chip handler 200 and the chip support member 250. The bridged module 150 includes two chips 100A, 100B mounted to the chip handler 200 and one bridge member 120 bonded to the two chips 100A, 100B by bridge-chip joints 130. The chips 100A, 100B shown in FIGS. 6A-6C has different thickness. For instance, the second chip 100B may be back-grinded to have a thickness smaller than the first chip 100A. Note that the chip handler 200, the chips 100 and the bridge member 120 shown in FIGS. 6A-6C are the same as those shown in FIGS. 1A-1D and FIGS. 2A-2D unless otherwise noted.

The chip handler 200 is used for handling, carrying, supporting and/or holding the first chip 100A and the second chip 100B from the front surfaces 102A, 102B during the manufacturing process. The chip support member 250 is also used for handling, carrying, supporting and/or holding the first chip 100A and the second chip 100B from their back surfaces 104A, 104B during the process.

As shown in FIG. 6A-6C, the chip support member 250 includes a first base part 252A and a second base part 252B. The first base part 252A has a first level surface for holding the first chip 100A from the back surface 104A. The second base part 253B has a second level surface for holding the second chip 100B from the back surface 104B. The positional relationship between the first level surface and the second level surface is fixed in the described embodiment.

The chip support member 250 further includes a first thickness adjustable layer 254A formed on the first base part 252A and a second thickness adjustable layer 254B formed on the second base part 252B. Note that a thickness of the base part 254 for each chip 100 is designed in a manner based on the nominal thickness of the chips 100A, 100B. The first and second thickness adjustable layers 254A, 254B are provided to eliminate the effect of thickness variation due to the manufacturing of the chips.

The chip support member 250 has also an opening 260, through which the underfill material is dispensed. For this purpose, the opening 260 is positioned at a predetermined location where the bridge member 120 is to be placed, as shown in FIG. 6C. When viewed from the top, the bridge member 120 (the front surface 122 thereof) can be seen through the opening 260 and the gap between the first and second chips 100A, 100B.

The chip support member 250 may include an attachable and detachable mechanism 256 for attaching and detaching the chip support member 250 to the chip handler 200. The chip support member 250 may have a set of holes 258A, 258B to fix the chips 100A, 100B to the chip support member 250. The set of holes 258A, 258B is connected to vacuum lines in an appropriate manner and used for sucking the back surfaces 104A, 104B of the chips 100A, 100B. Note that in other embodiments the attachable and detachable mechanism may be provided with the chip handler 200 instead of the chip support member 250.

The chip support member 250 may be made of any material such as silicon, metal, ceramic, etc., similar to that of the chip handler 200. For its purpose, the material of the chip support member 250 may have certain degree of rigidity. Examples of the material suitable for making the chip support member 250 may include Mo, Ti, Zr, Hastelloy™ (Ni, Mo, Cr), and the like.

With reference now to a series of FIGS. 7A-7D and FIGS. 8A-8D, a schematic of a process for manufacturing a bridged multichip module using a chip handler and a chip support member is shown, according to an embodiment of the present invention. It should be noted that FIGS. 7A-7D and FIGS. 8A-8D show cross-section views corresponding to the cross-section denoted by line B-B' in the top and bottom views of FIG. 6C, similarly to FIGS. 3A-3E and FIGS. 4A-4E.

Figure 7A:
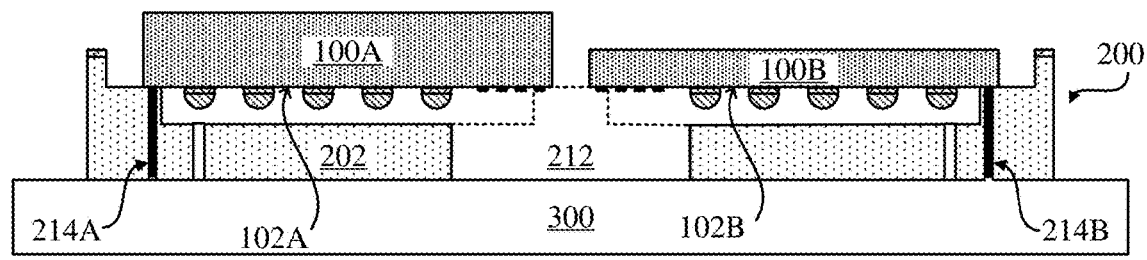
FIG. 7A illustrates a first step of a process for manufacturing a bridged multichip module by using a chip handler and a chip support member, according to an embodiment of the present invention.

As shown in FIG. 7A, the process may include a step of mounting a first chip 100A and a second chip 100B with an alignment mark (not shown), followed by sucking a front surfaces 102A, 102B of the first and second chips 100A, 100B by a set of holes 214A. The chip handler 200 is placed on a bonding stage 300 of a chip bonder. The chips 100A, 100B are mounted to the chip handler 200 and the front surfaces 102A, 102B of the chips 100A, 100B are vertically aligned even though those have different thicknesses.

Figure 7B:
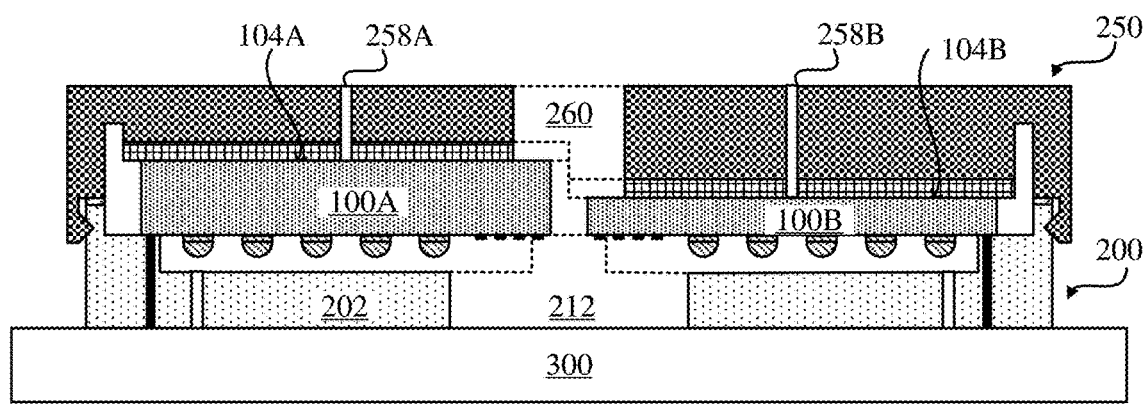
FIG. 7B is a cross-sectional view of the chip handler depicting the step of attaching the chip support member to the chip handler, according to an embodiment of the present invention.

As shown in FIG. 7B, the process may also include a step of attaching the chip support member 250 to the chip handler 200 to support the chips 100A, 100B by the chip support member 250 from their back surfaces 104A, 104B.

Figure 7C:
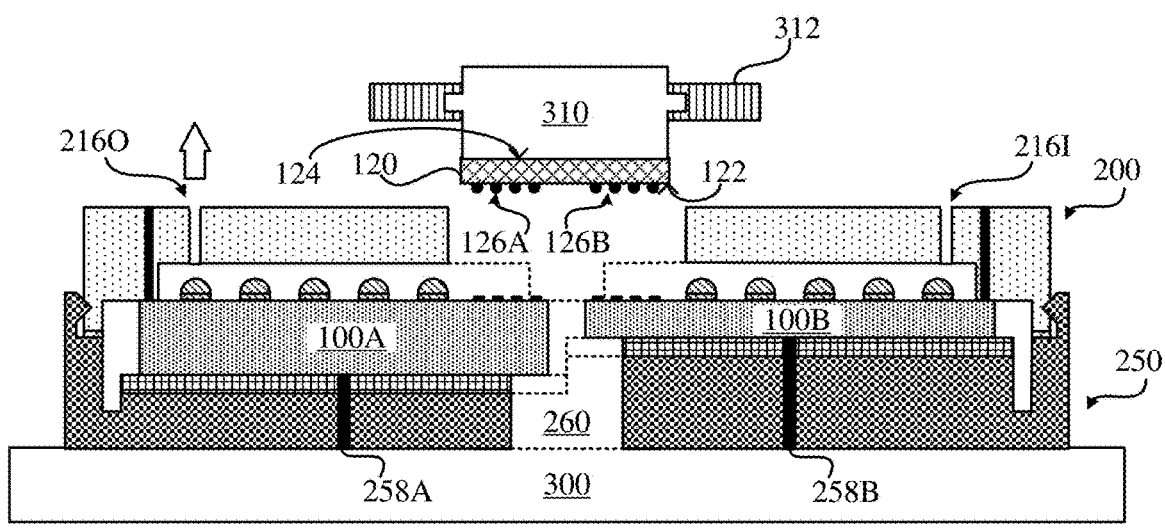
FIG. 7C is a cross-sectional view of the chip handler depicting the step of preparing a bridge member attached to a bridge handler, according to an embodiment of the present invention.

As shown in FIG. 7C, the manufacturing process may further include a step of preparing a bridge member 120 attached to a bridge handler 310 that has a gas leakage stopper 312 fixed thereto. The bridge member 120 may be supported by the handler body of the bridge handler 310 from the back surface 124 so that the front surface 122 including the terminals 126A, 126B faces down. Note that the chip handler 200, the chip support member 250 and the chips 100A, 100B are flipped.

Figure 7D:
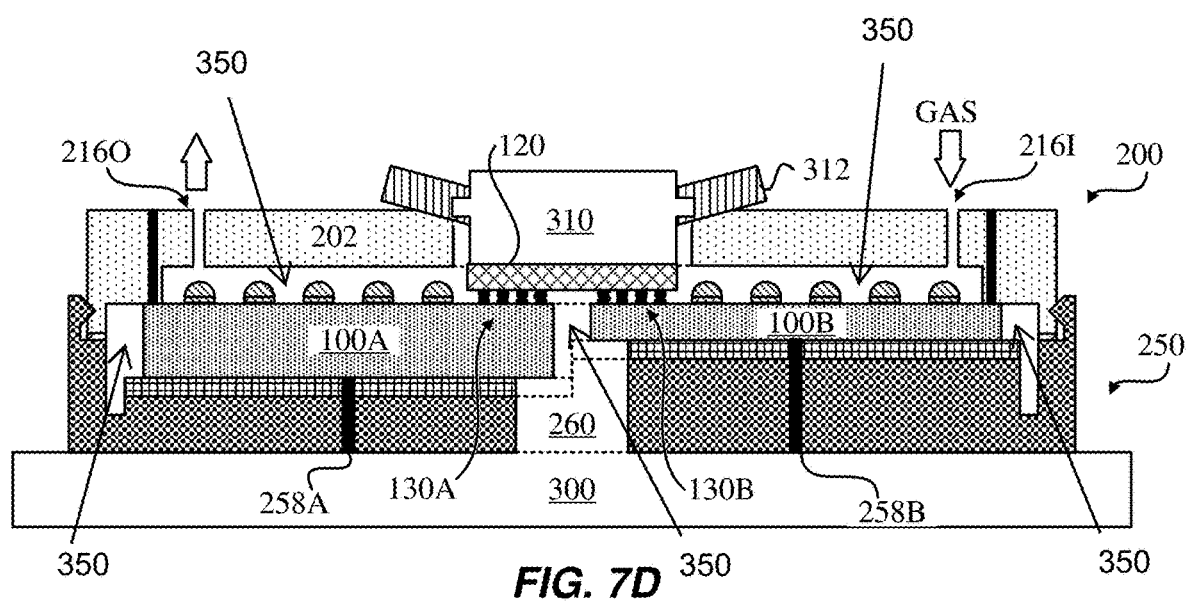
FIG. 7D is a cross-sectional view of the chip handler depicting the step of inserting the bridge member through an opening of the chip handler, according to an embodiment of the present invention.

As shown in FIG. 7D, the manufacturing process may also include a step of inserting the bridge member 120 through the opening 212 of the chip handler 200 with an alignment mark (not shown) so as to place the bridge member 120 onto the chips 100A, 100B. During the inserting step, the gas leakage stopper 312 touches on the top of the chip handler 200. As also shown in FIG. 7D, the process may further include a step of suppling reduction gas into the chamber space 350 to remove oxide formed at the terminals. The process may also include a step of elevating the temperature, a step of performing solder joining, a step of displacing gas by inert gas and a step of cooling down. By performing the solder joining, the bridge-chip joints 130A, 130B are formed between the bridge member 120 and the chips 100A, 100B, respectively. In the described embodiment, flip chip bonding is performed in a reduction gas environment similar to the one in the embodiment described in FIGS. 3A-3E and FIGS. 4A-4E.

Figure 8A:
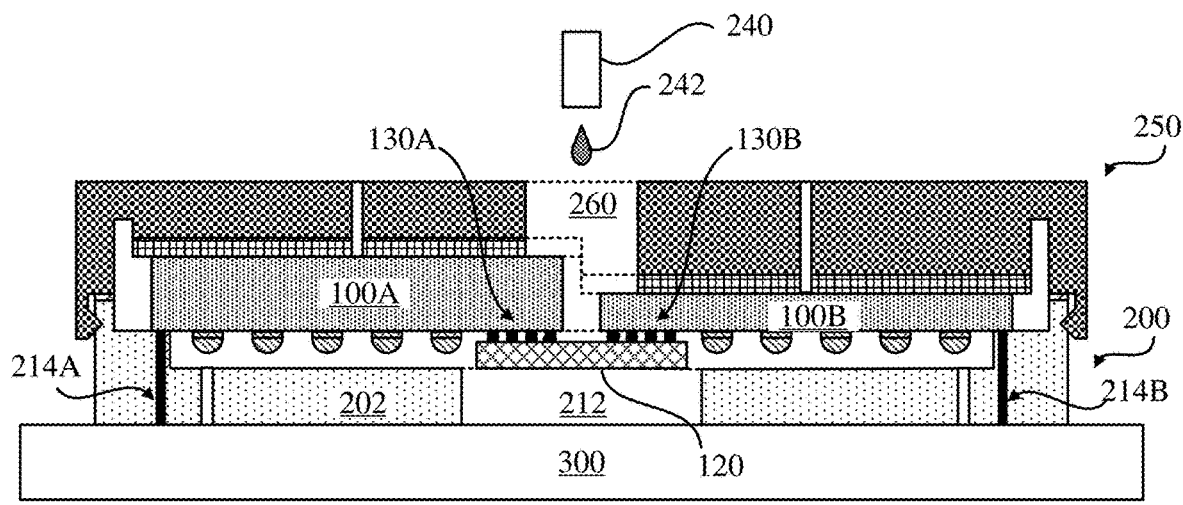
FIG. 8A is a cross-sectional view of the chip handler depicting the steps of releasing the bridge member from the handler body of the bridge handler, pulling the handler body of the bridge handler out of the chip handler, reversing the assembly of the chip handler and the chip support member, and dispensing an underfill material, according to an embodiment of the present invention.

As shown in FIG. 8A, the process may further include a step of releasing the bridge member 120 from the handler body of the bridge handler 310; a step of pulling the handler body of the bridge handler 310 out of the chip handler 200; a step of reversing the assembly of the chip handler 200 and the chip support member 250; and a step of dispensing an underfill material, from a side of the chip's back surfaces 104A, 104B, to a place around the bridge-chip joints 130A, 130B. The droplet 242 of the underfill material is injected through the opening 260 from the jet dispenser 240 placed behind.

Figure 8B:
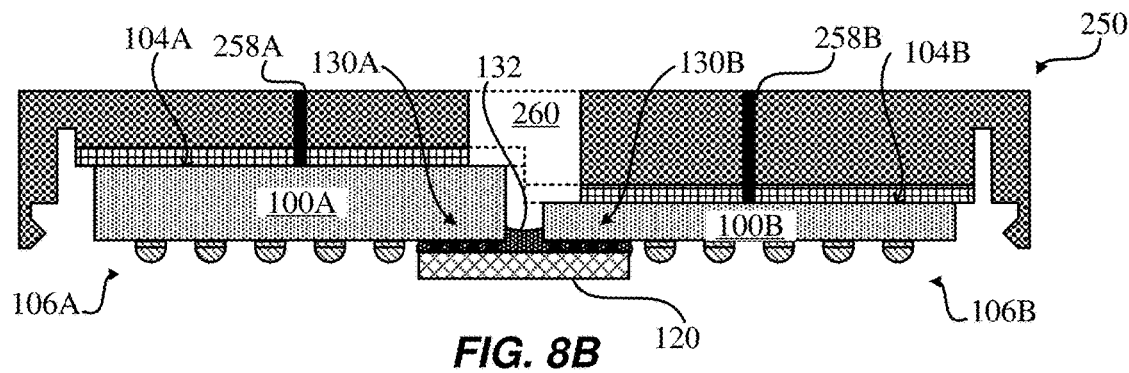
FIG. 8B is a cross-sectional view of the chip handler depicting the step of releasing the bridged module from the chip handler, according to an embodiment of the present invention.

As shown in FIG. 8B, the manufacturing process may also include a step of releasing the bridged module 150 from the chip handler 200 by turning off the suction of the holes 214 and picking up the bridged module 150 by the chip support member 250. The suction of the holes 258 is now turned on to suck the back surfaces 104A, 104B of the chips 100A, 100B. The process may also include a step of curing the dispensed underfill material 132 in an oven.

Figure 8C:
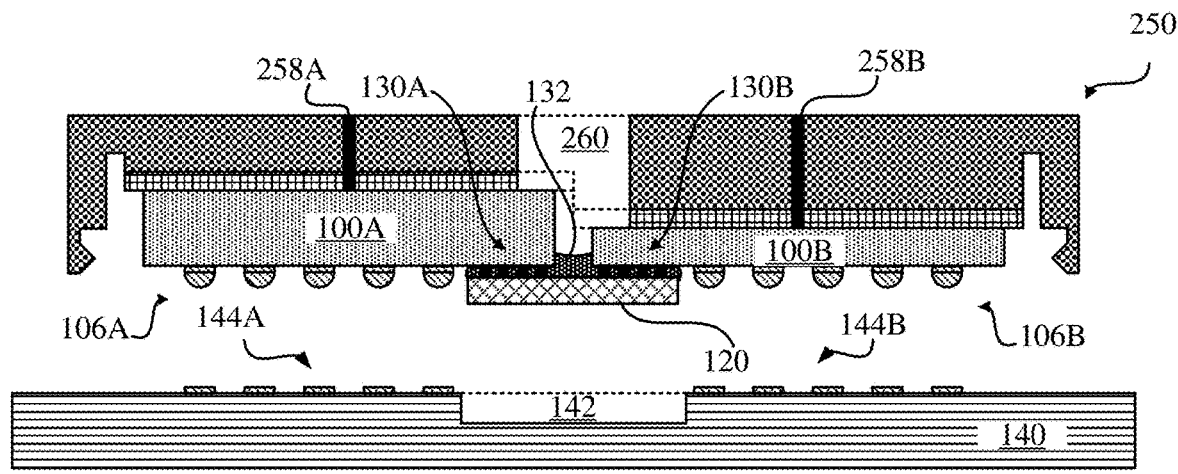
FIG. 8C is a cross-sectional view of the chip handler depicting the step of preparing a substrate with contact pads, according to an embodiment of the present invention.
Figure 8D:
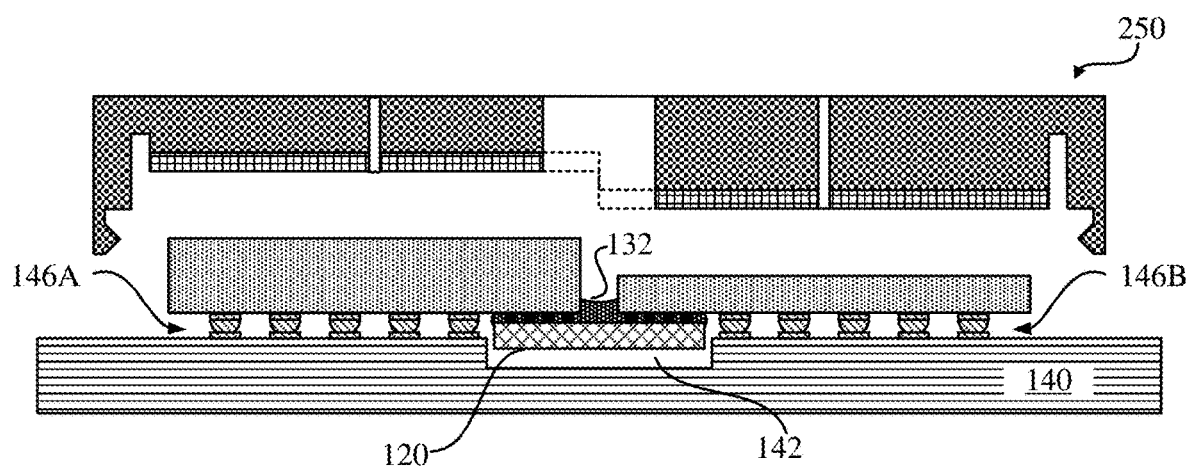
FIG. 8D is a cross-sectional view of the chip handler depicting the steps of mounting the bridged module on the substrate and performing a reflow, according to an embodiment of the present invention.

As shown in FIG. 8C, the process may also include a step of preparing a substrate 140 with a contact pads 144A, 144B formed on its surface. The substrate 140 may have a recess or cavity 142 to avoid interference between the substrate 140 and the bridge member 120 to be mounted thereon. As shown in FIG. 8D, the manufacturing process may also include a step of mounting the bridged module 150 on the substrate 140 and a step of performing reflow. By performing the reflow, a sets of joints 142A, 142B are formed between the chips 100A, 100B and the substrate 140. After the reflow step, any appropriate packaging process may be conducted to manufacture the final bridged multichip module.

Figure 9A:
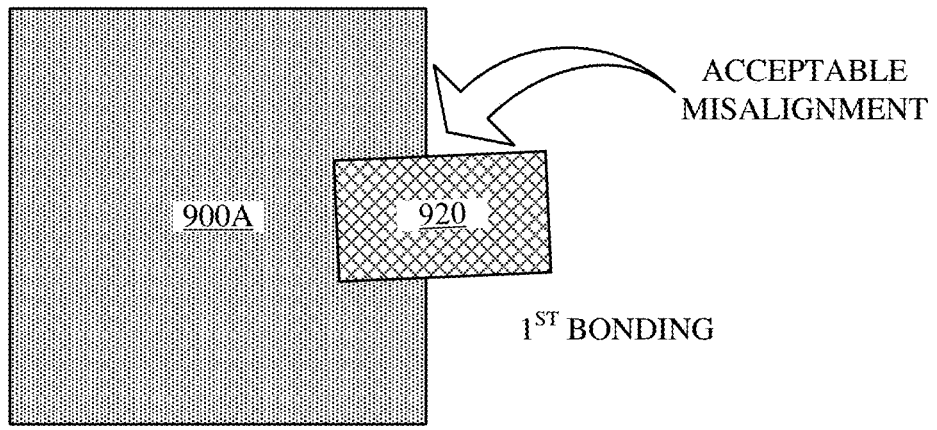
FIG. 9A illustrates a first bonding stage in which a misalignment occurs when two chips and a bridge member are bonded in sequence without using the chip handler, according to an embodiment of the present invention.
Figure 9B:
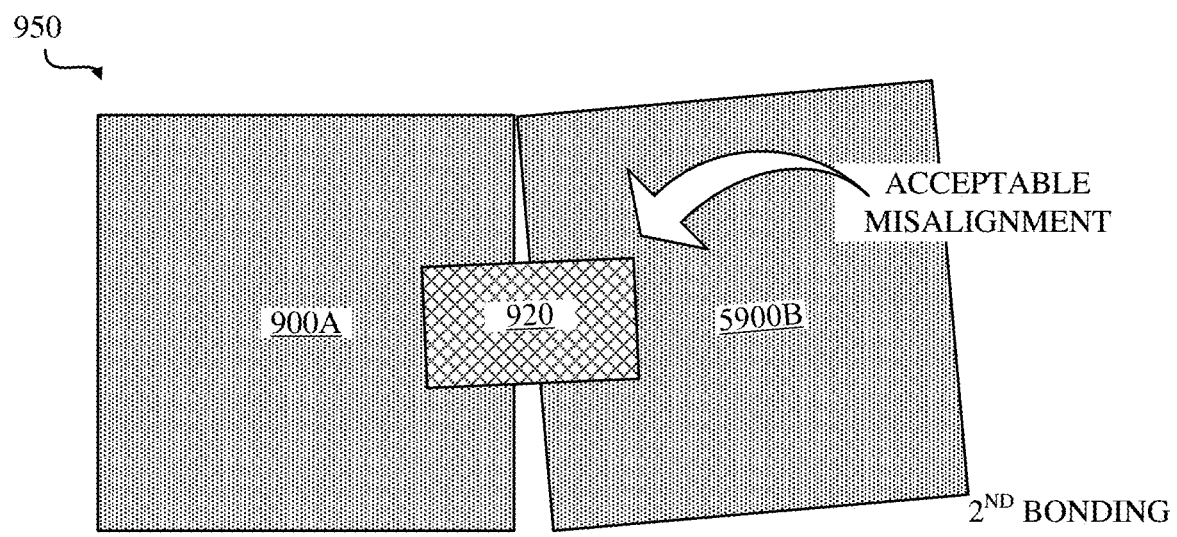
FIG. 9B illustrates a second bonding stage in which a misalignment occurs when two chips and a bridge member are bonded in sequence without using the chip handler, according to an embodiment of the present invention.
Figure 9C:
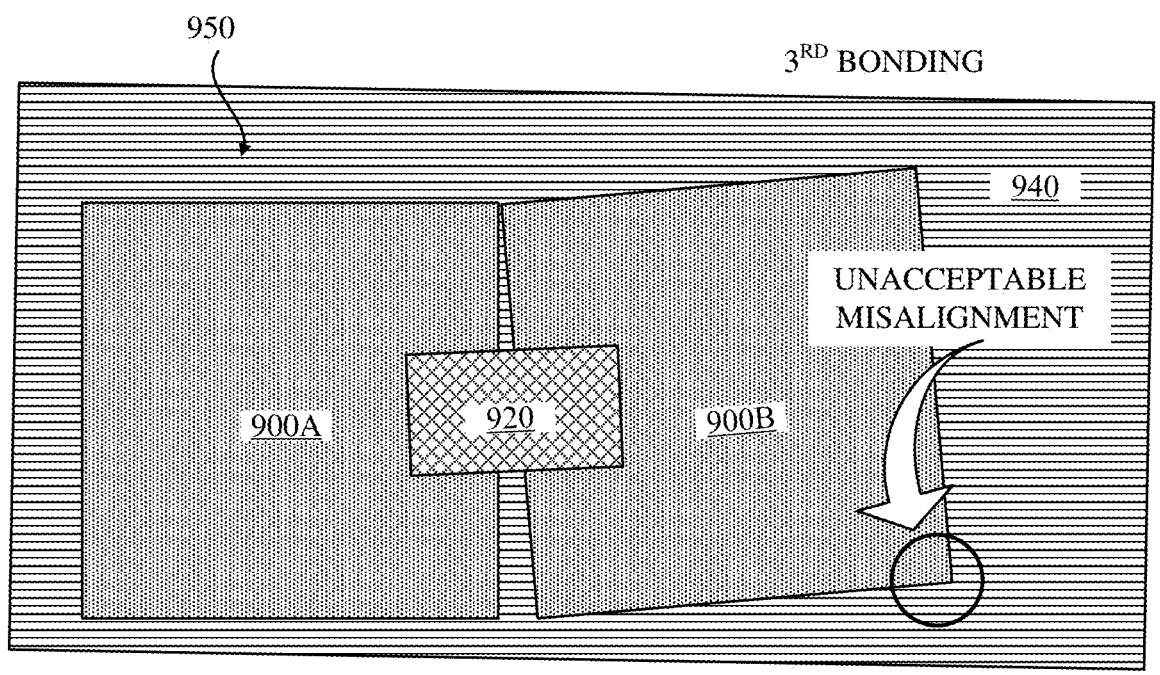
FIG. 9C illustrates a third bonding stage in which a misalignment occurs when two chips and a bridge member are bonded in sequence without using the chip handler, according to an embodiment of the present invention.

FIGS. 9A-9C illustrate a schematic of misalignment when two chips and a bridge member are bonded in sequence without using the chip handler 200, according to an embodiment of the present invention. The chip handler 200 provides function to perform precise pre-alignment between a plurality of chips 100. If the chip handler 200 is not used, each alignment accuracy between the first chip 100A and the bridge member 120, between the second chip 100B and the bridge member 120 requires 10 times more preciseness to prevent misalignment between the first chip 100A and the second chip 100B, which would be bonded to the external substrate.

FIG. 9A illustrates a schematic of misalignment in first bonding that bonds a bridge member 920 to a first chip 900A. FIG. 9B illustrates a schematic of misalignment in second bonding that bonds a second chip 900B to the bridge member 920 that has been already bonded to the first chip 900A. The second bonding results in a bridge module 950. Let us assume that the misalignments in the first and second bonding processes are individually acceptable. FIG. 9C illustrates a schematic of misalignment in third bonding that bonds the bridge module 950 to the substrate 940. Even though each of the misalignments in the first and second bonding is individually acceptable, the misalignment between the bridge module 950 and the substrate 940 may be unacceptable. When considering that rotational misalignment of certain degrees occurs, the displacement increases as the distance from the joint point increases, so the misalignment at a position away from the joints can be unacceptable.

In contrast to the related process, the chip handler 200 according to the exemplary embodiments of the present invention enables the following process: one bridge member is bonded on two areas on "different chips", which are pre-aligned against the chip handler 200 with an alignment mark that has mask-design level precision, then the bridged two chips are bonded on the substrate at the same time.

Figure 10A:
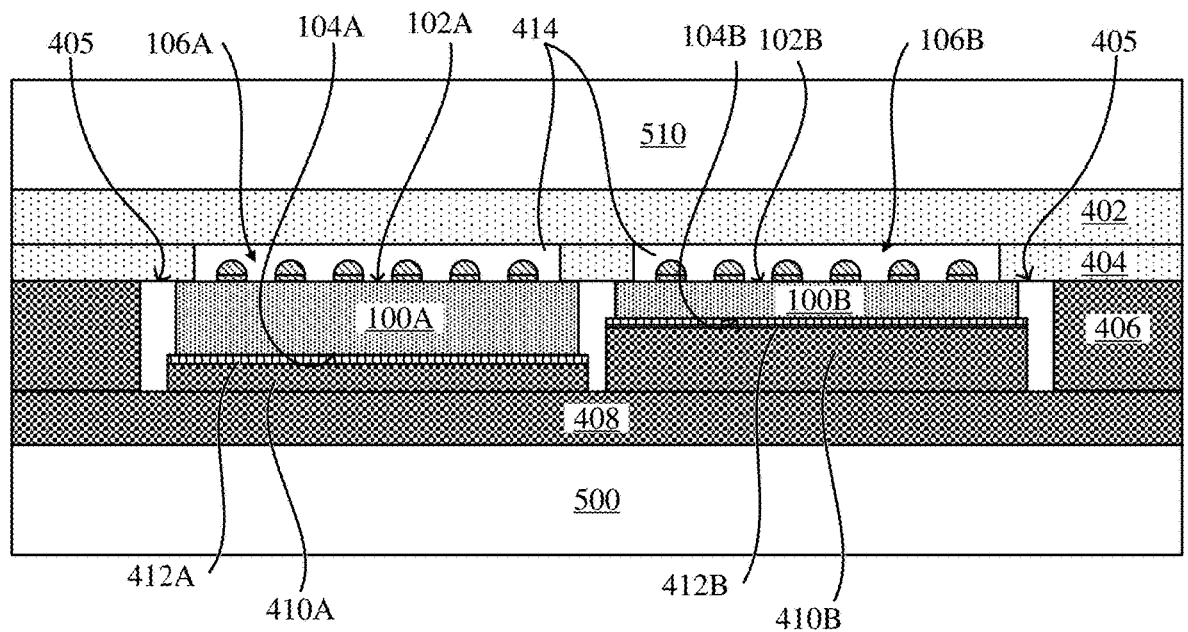
FIG. 10A is a cross sectional view of a set of chip handling fixtures and a bridged module carried by the set of chip handling fixtures, according to an embodiment of the present invention.
Figure 10B:
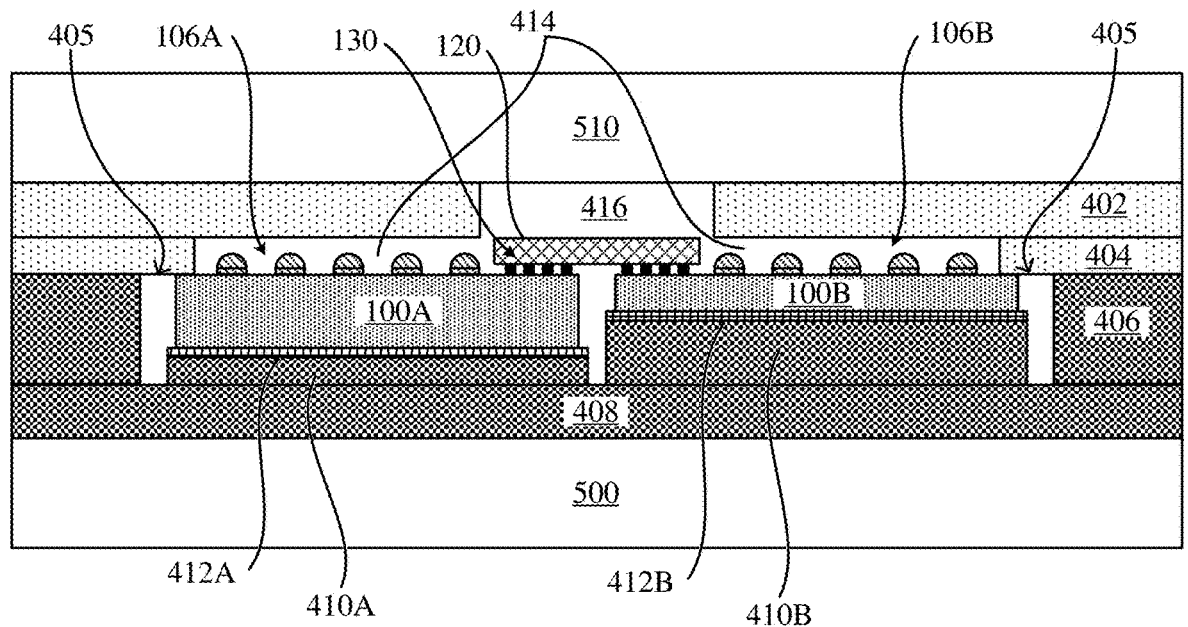
FIG. 10B is a cross sectional view of the set of chip handling fixtures, a bonding stage and a bonding head with a bridged module carried by the set of chip handling fixtures, according to an embodiment of the present invention.

With reference to FIGS. 10A-10B, a schematic of a set of chip handling fixtures that works equivalent to a combination of the chip handler 200 and the chip support member 250 shown in FIGS. 6A-6C is described, according to an embodiment of the present invention. The set of chip handling fixtures shown in FIGS. 10A-10B is preferably used for interconnecting a plurality of chips having difference thickness as similar to the embodiment shown in FIGS. 6A-6C.

FIGS. 10A-10B describe a set of chip handling fixtures, a bonding stage 500 and a bonding head 510 with a bridged module 150 carried by the set of chip handling fixtures. FIGS. 10A and 10B show cross-sectional views of the structure.

As shown in FIGS. 10A-10B, the set of chip handling fixtures includes two baseline fixtures 402, 404 (the first baseline fixture 404 and the second baseline fixture 402) and four stage fixtures 406, 408, 410A, 410B (the first stage fixture 408, the second stage fixture 406 and the third stage fixtures 410A, 410B). Note that the set of chip handling fixtures 402-408, 410A and 410B corresponds to a set of parts obtained by dividing the assembles of the chip handler 200 and the chip support member 250 shown in FIGS. 6A-6C into a plurality of parts. The set of chip handling fixtures 402-408, 410A and 410B is placed between the bonding stage 500 and the bonding head 510.

A first stack of the first baseline fixture 404, the second baseline fixture 402 and the second stage fixture 406 (a part thereof) corresponds to the chip handler 200. A second stack of the second stage fixture 406 (a part thereof), the first stage fixture 408 and the third baseline fixtures 410A, 410B corresponds to the chip support member 250. Unless otherwise noted, the functionality of the first stack of fixtures (402, 404, 406) and the second stack of fixtures (406, 408, 410A, 410B) are almost same as the chip handler 200 and the chip support member 250 shown in FIGS. 6A-6C, respectively.

The first baseline fixture 404 provides a cavity 414 and a support surface 405 corresponding to the cavity 208 and the support surface 204 of the chip handler 200, respectively. The second baseline fixture 402 has an opening 416 corresponding to the opening 212 of the chip handler 200. The third stage fixtures 410A, 410B correspond to the first and second base parts 252A, 252B of the chip support member 250. The layer 412A, 412B formed on the third baseline fixtures 410A, 410B correspond to the first and second thickness adjustable layers 254A, 254 of the chip support member 250.

Figure 11A:
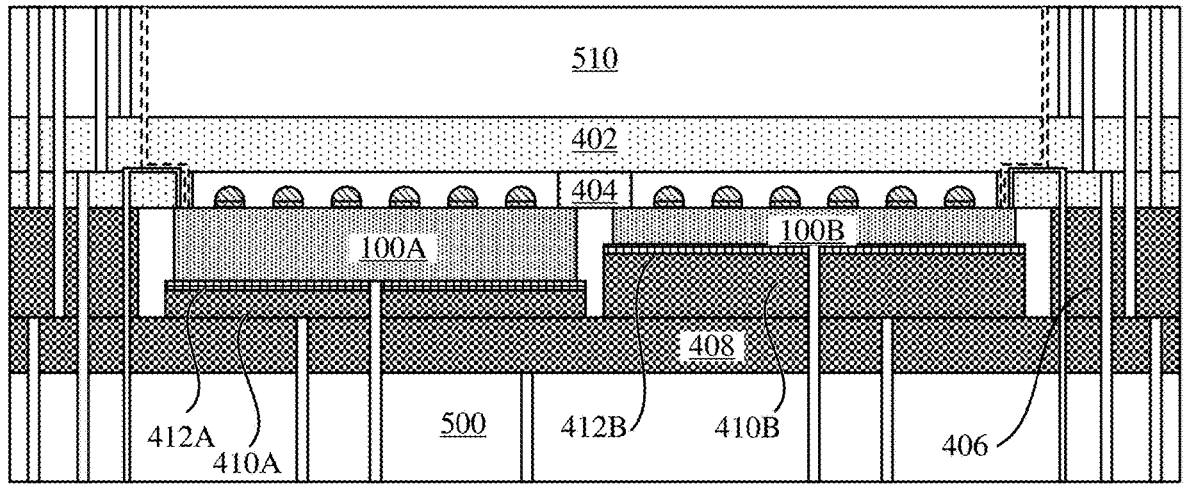
FIG. 11A is a cross-sectional view of a set of suction lines formed in the set of chip handling fixtures, according to an embodiment of the present invention.
Figure 11B:
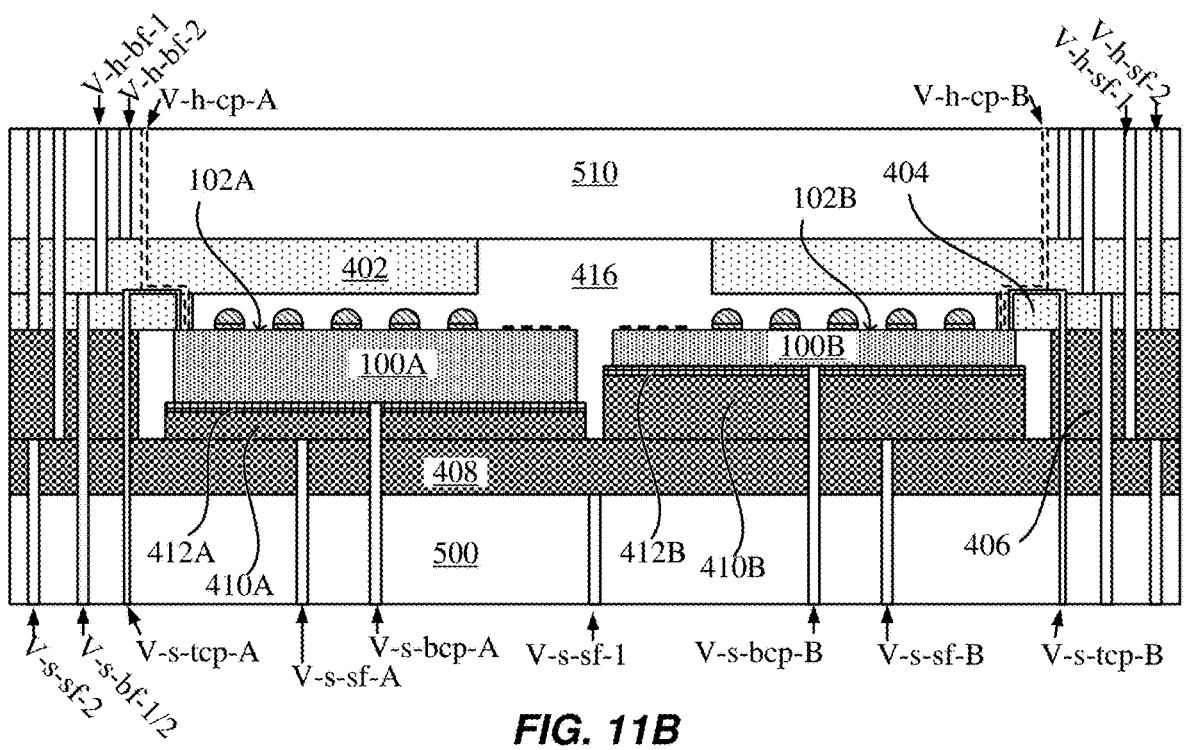
FIG. 11B is a cross-sectional view of the set of suction lines, according to an embodiment of the present invention.
Figure 11C:
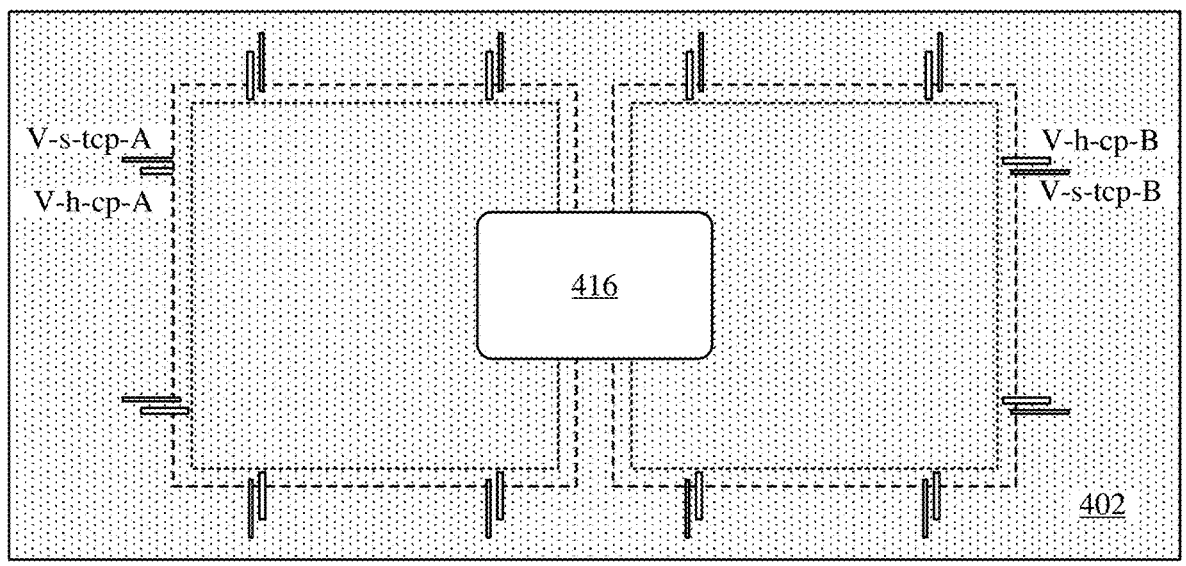
FIG. 11C is a plane view of a surface of a second baseline fixture, according to an embodiment of the present invention.

The set of chip handling fixtures is provided with a set of suction lines for fixing and releasing these fixtures to and from the bonding stage 500 and the bonding head 510 by suction force. FIGS. 11A-11C describe a set of suction lines (denoted as format 'V-x-yy-z') formed in the set of chip handling fixtures. FIGS. 11A and 11B also show cross-sectional views whereas FIG. 11C shows a plane view of the surface of the second baseline fixture 402. Note that the gas inlet and the gas outlet, which are shown in FIGS. 6A-6B, is omitted.

As shown in FIGS. 11A-11B, there is a plurality of suction lines (or channels) for sucking or suctioning the fixtures, each of which is formed through at least one element of the fixtures, the bonding stage 500 and the bonding head 510, and is routed from the bonding stage or head side. Functions of the suction lines for sucking the fixtures is as follows:

A suction line denoted by V-h-bf-1 is formed through the bonding head 510 and the second baseline fixture 402 and is routed from the bonding head side (-h) to reach the surface of the first baseline fixture 404 (-bf-1).

A suction line denoted by V-h-bf-2 is formed through the bonding head 510 and is routed from the bonding head side (-h) to reach the surface of the second baseline fixture 402 (-bf-2).

A suction line denoted by V-h-sf-1 is formed through the bonding head 510, the baseline fixtures 402, 404 and the second stage fixture 406 and is routed from the bonding head side (-h) to reach the surface of the first stage fixture 408 (-sf-1).

A suction line denoted by V-h-sf-2 is formed through the bonding head 510 and the baseline fixtures 402, 404 and is routed from the bonding head side (-h) to reach the surface of the second stage fixture 406 (-sf-2).

A suction line denoted by V-s-sf-1 is formed through the bonding stage 500 and is routed from the bonding stage side (-s) to reach the surface of the first stage fixture 408 (-sf-1).

A suction line denoted by V-s-sf-2 is formed through the bonding stage 500 and the first stage fixture 408 and is routed from the bonding stage side (-s) to reach the surface of the second stage fixture 406 (-sf-2).

Suction lines denoted by V-s-bf-½ (abbreviated) are formed through the bonding stage 500 and the stage fixtures 406, 408 (and also the first baseline fixture 404 for bf-2) and is routed from the bonding stage side (-s) to reach the surface of the first baseline fixture 404 (the second baseline fixture 402 for bf-2).

A suction line denoted by V-s-sf-A is formed through the bonding stage 500 and the first stage fixture 408 and is routed from the bonding stage side (-s) to reach the surface of the third stage fixture 410A.

A suction line denoted by V-s-sf-B is formed through the bonding stage 500 and the first stage fixture 408 and is routed from the bonding stage side (-s) to reach the surface of the third stage fixture 410B.

As shown in FIGS. 11A-11B, there is also a plurality of suction lines (or channels) for sucking the chips 100A, 100B, each of which is formed through at least one element of the fixtures, the bonding stage 500 and the bonding head 510 and is routed from the bonding stage or head side. Functions of the suction lines for sucking the chips is as follows:

A suction line denoted by V-h-cp-A is formed through the elements 510, 402, is traversed along with the surface of the second baseline fixture 402, is then extended through the second baseline fixture 404 and is routed from the bonding head side (-h) to reach the support surface 405 and the front surface 102A of the first chip 100A (cp-A).

A suction line denoted by V-h-cp-B is formed through the elements 510, 402, is traversed along with the surface of the second baseline fixture 402, is then extended through the second baseline fixture 404 and is routed from the bonding head side (-h) to reach the support surface 405 and the front surface 102B of the second chip 100B (cp-B).

A suction line denoted by V-s-tcp-A is formed through the elements 500, 408, 406, 404, is traversed along with the surface of the second baseline fixture 402, is then extended back through the second baseline fixture 404 and is routed from the bonding head side (-s) to reach the support surface 405 and the front surface 102A of the first chip 100A (tcp-A).

A suction line denoted by V-s-tcp-B is formed through the elements 500, 408, 406, 404, is traversed along with the surface of the second baseline fixture 402, then extended back through the second baseline fixture 404 and is routed from the bonding head side (-s) to reach the support surface 405 and the front surface 102B of the second chip 100B (tcp-B).

A suction line denoted by V-s-bcp-A is formed through the bonding stage 500 and the stage fixtures 408, 410A and is routed from the bonding head side (-s) to reach the back surface 104A of the first chip 100A (bcp-A).

A suction line denoted by V-s-bcp-B is formed through the bonding stage 500 and the stage fixtures 408, 410B and is routed from the bonding head side (-s) to reach the back surface 104B of the second chip 100B (bcp-B).

The channels traversed along with the surface of the second baseline fixture 402 for the suction lines denoted by V-h-cp-A, V-h-cp-B, V-s-tcp-A, V-s-tcp-B are depicted in FIG. 11C that shows a plane view of the surface of the second baseline fixture 402. Note that vertical holes formed through the second baseline fixture 402 corresponding to other suction lines are omitted in FIG. 11C.

The suction lines denoted by V-h-cp-A, V-h-cp-B, V-s-tcp-A, and V-s-tcp-B correspond to the set of holes 214 formed on the support surface 204. The suction lines denoted by V-s-bcp-A, V-s-bcp-B correspond to the set of holes 258A, 258B of the chip support member 250.

The set of suction lines denoted by V-s-tcp-A, V-s-tcp-B is a first set of channels routed from the bonding stage side to the holes formed on the support surface 405. The set of suction lines denoted by V-h-cp-A, V-h-cp-B is a second set of channels routed from the bonding head side to holes formed on the support surface 405.

Figure 12A:
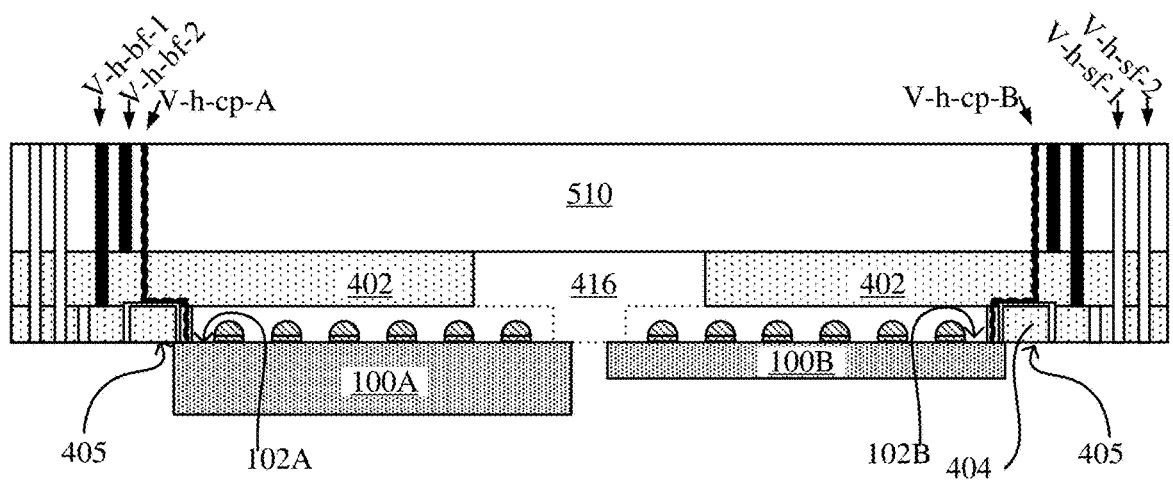
FIG. 12A illustrates operations of the set of suction lines in the set of chip handling fixtures, according to an embodiment of the present invention.
Figure 12B:
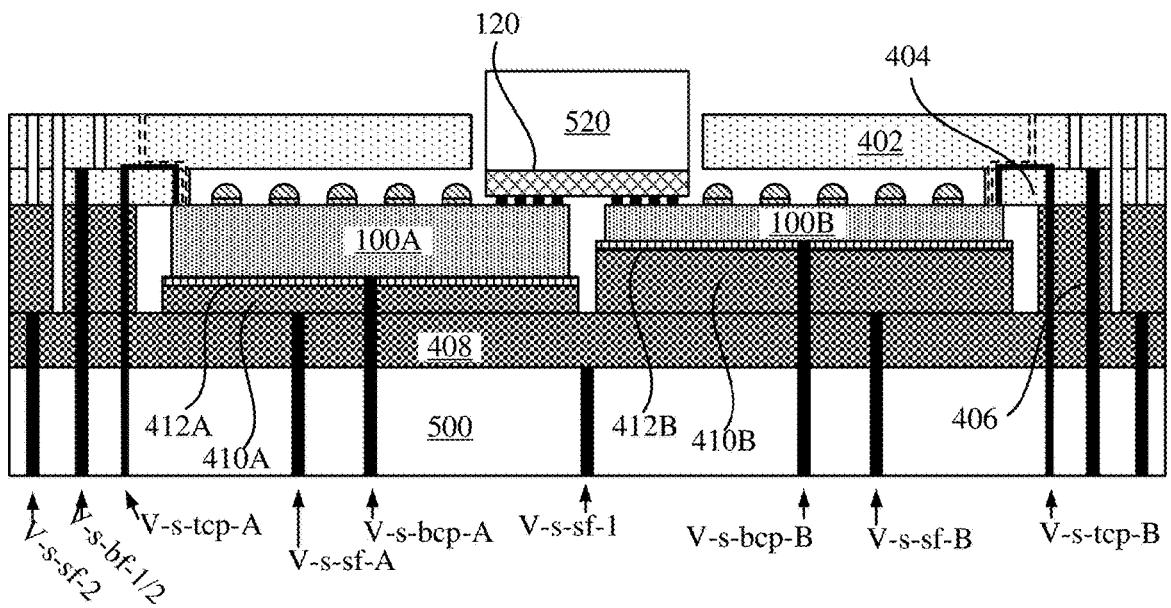
FIG. 12B illustrates operations of the set of suction lines in the set of chip handling fixtures in which evacuation of the suction lines from the bonding stage are turned on, according to an embodiment of the present invention.

FIGS. 12A-12B illustrates operations of the set of suction lines in the chip handling fixtures. FIGS. 12A and 12B also show cross-sectional views of the structure. Note that in FIGS. 12A-12B (the same may hold for remaining figure FIGS. from 13A to 18C), a solid bold line represents a suction line (or channel) where the vacuum is currently turned on.

The operation shown in FIG. 12A corresponds to the situation shown in FIG. 7A. As shown in FIG. 12A, the first and second chips 100A, 100B are attached to the support surface 405 provided by the first baseline fixture 404 and the front surface 102A, 102B are sucked by the suction lines V-h-cp-A, V-h-cp-B. In this situation, the evacuation of the suction lines V-h-bf-1, V-h-bf-2, V-h-cp-A, V-h-cp-B is turned on.

The operation shown in FIG. 12B corresponds to the situation shown in FIG. 7D. As shown in FIG. 12B, the chips 100A, 100B are held by the set of chip handling fixtures 402-408, 410A, 410B. In this situation, the evacuation of the suction lines from the bonding stage side (V-s-sf-1, V-s-sf-½, V-s-tcp-A, V-s-bcp-A, V-s-tcp-B, V-s-bcp-B) are turned on. The evacuation of the suction lines from the bonding head side are turned off. The bridge member 120 held by the bridge handler 520 can be inserted through the opening 416 of the second baseline fixture 402. Although not shown inf FIG. 12B, if the bridge handler 520 has a gas leakage stopper, which is preferably used in the case of applying the underfill after the bridging, the gas leakage stopper may touch on the top of the second baseline fixture 402 to seal the gap between the second baseline fixture 402 and the bridge handler 520.

With reference to a series of FIGS. 13A-13C, FIGS. 14A-14C, FIGS. 15A-15C and FIGS. 16A-16B, a schematic of a process for manufacturing a bridged multichip module using a set of chip handling fixtures according to an exemplary embodiment of the present invention is described. Note that FIGS. 13A-13C, FIGS. 14A-14C, FIGS. 15A-15C and FIGS. 16A-16B also show cross-section views as similar to FIGS. 3A-3E and FIGS. 4A-4E and FIGS. 7A-7D and FIGS. 8A-8D.

Figure 13A:
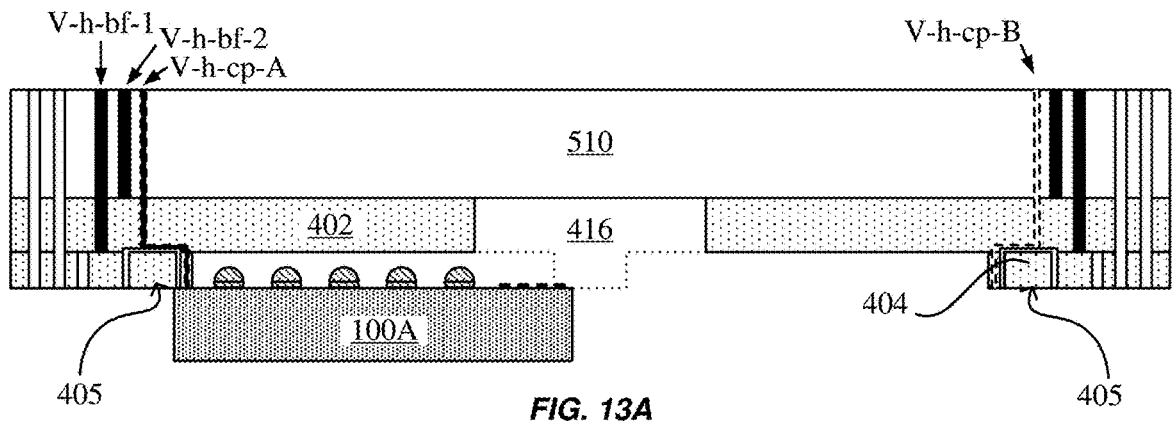
FIG. 13A is a cross-sectional view of a chip handle structure depicting a first step of a process for manufacturing the bridged multichip module using the set of chip handling fixtures, according to an embodiment of the present invention.
Figure 13B:
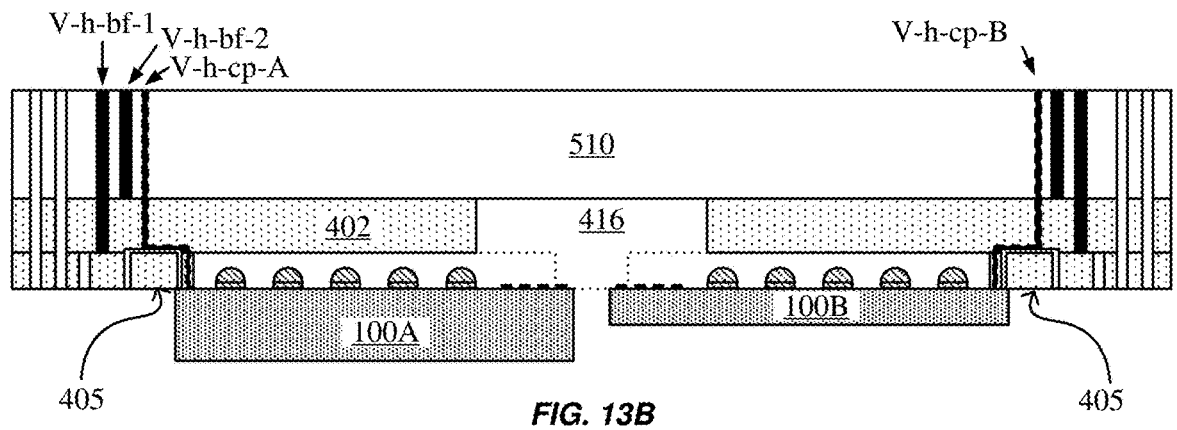
FIG. 13B is a cross-sectional view of the chip handle structure depicting the step of mounting a second chip with an alignment mark, according to an embodiment of the present invention.

As shown in FIG. 13A, the manufacturing process may include a step of preparing a baseline fixtures 402, 404 by turning on the evacuation of the suction lines V-h-bf-2, V-h-bf-1. The manufacturing process may include a step of mounting a first chip 100A with an alignment mark (not shown), followed by turning on the suction line V-h-cp-A to suck the front surface 102A of the first chip 100A by holes that are formed on the support surface 405 and are routed from the bonding head side. As shown in FIG. 13B, the manufacturing process may include a step mounting a second chip 100B with an alignment mark (not shown), followed by turning on the suction line V-h-cp-B to suck the front surface 102B of the second chip 100B by holes that are formed on the support surface 405 and are routed from the bonding head side. In a particular embodiment where pre-applied underfill are employed, the chips 100A, 100B optionally have pre-applied underfill on their chip surface.

Figure 13C:
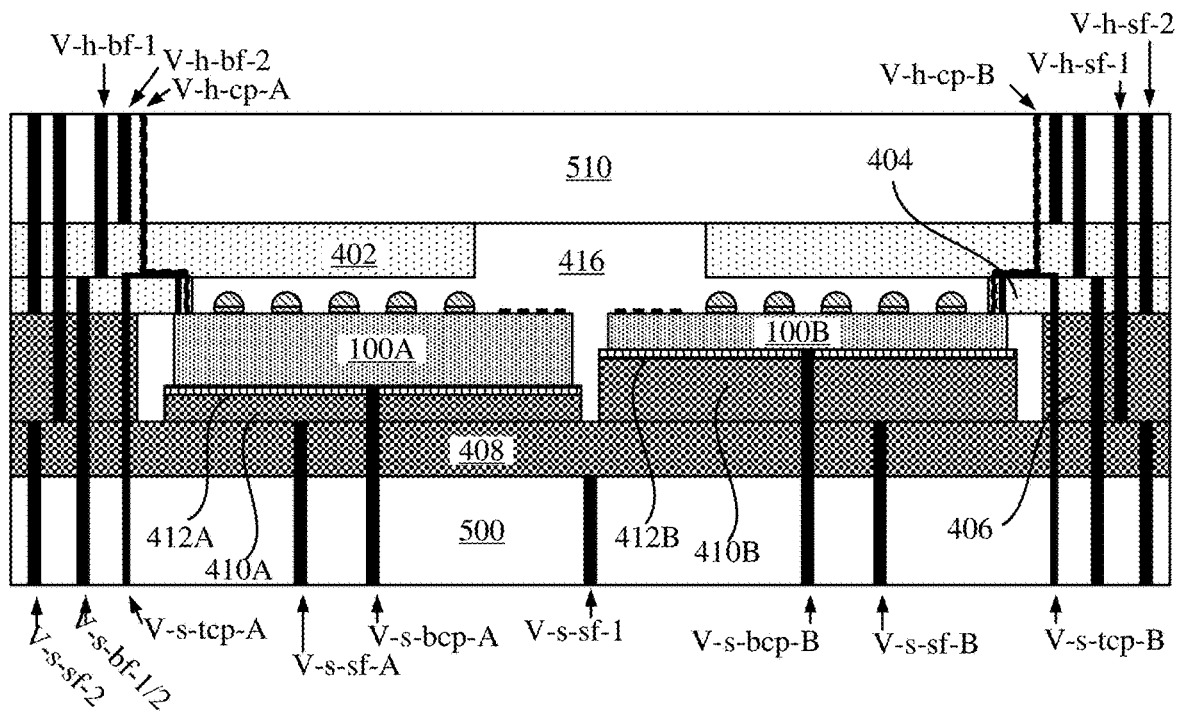
FIG. 13C is a cross-sectional view of the chip handle structure depicting the step of attaching a stage fixtures to the baseline fixtures by turning on remaining suction lines, according to an embodiment of the present invention.

As shown in FIG. 13C, the manufacturing process may include a step of attaching a stage fixtures 406, 408, 410A, 410B to the baseline fixtures 402,404 by turning on remaining suction lines (V-s-sf-1, V-s-sf-2, V-s-bf-½, V-s-sf-A, V-s-tcp-A, V-s-bcp-A, V-s-sf-B, V-s-tcp-B, V-s-bcp-B, V-h-sf-1, V-h-sf-2). The attaching step may include a sub-step of placing the first stage fixture 408 on the bonding stage 500 and turning on the suction line V-s-sf-1. The attaching step may include a sub-step of placing the third stage fixtures 410A and 410B on the first stage fixture 408 and turning on the suction lines V-s-sf-A, V-s-sf-B, respectively. The attaching step may include a sub-step of placing the second stage fixture 406 on the first stage fixture 408 and turning on the suction line V-s-sf-2. The attaching step may include a sub-step of placing the baseline fixtures 402, 404 (the chips 100A, 100B) on the second stage fixture 406 and turning on the suction lines V-s-bcp-A, V-s-bcp-B, V-s-tcp-A, V-s-tcp-B, V-s-bf-½, V-h-sf-1, V-h-sf-2. By turning on the suction lines V-s-tcp-A, V-s-tcp-B, the front surfaces 102A, 102B of the chips 100A, 100B are sucked by holes that are formed on the support surface 405 and are routed from the bonding stage side.

Figure 14A:
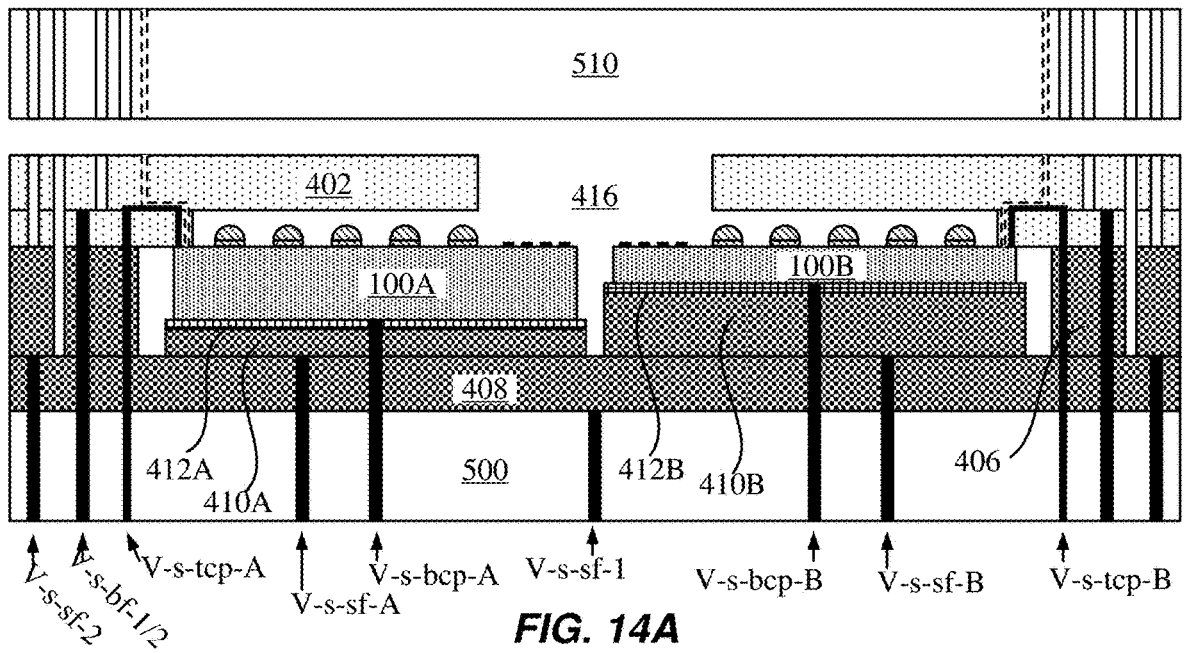
FIG. 14A is a cross-sectional view of the chip handle structure depicting the steps of turning off all the suction functions of the bonding head and releasing the bonding head from the fixtures, according to an embodiment of the present invention.

As shown in FIG. 14A, the manufacturing process may include a step of turning off all the suction functions of the bonding head 510 (V-h-**-*) and releasing the bonding head 510 from the fixtures.

Figure 14B:
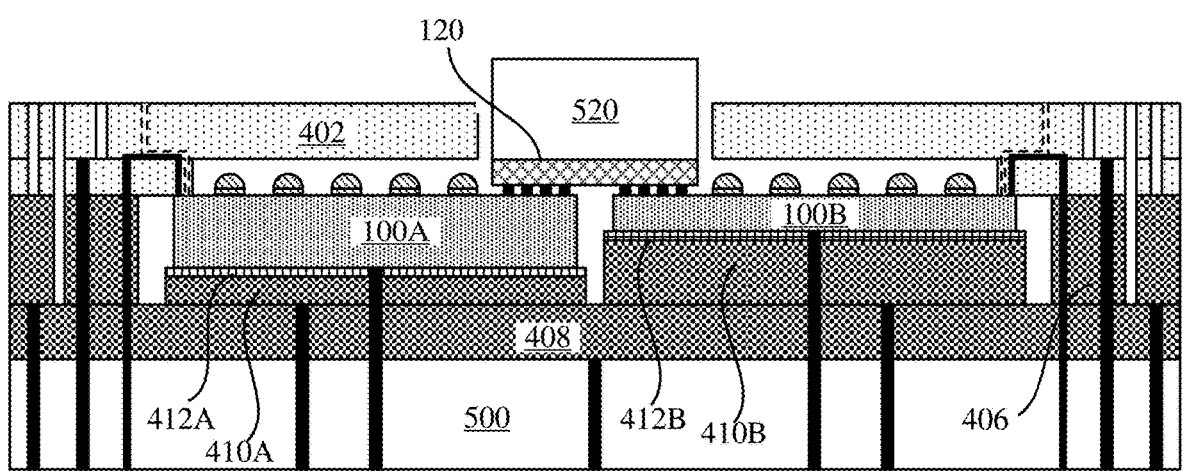
FIG. 14B is a cross-sectional view of the chip handle structure depicting the step of inserting the bridge member by the bridge handler through the opening of the second baseline fixture, according to an embodiment of the present invention.

As shown in FIG. 14B, the manufacturing process may also include a step of inserting the bridge member 120 by the bridge handler 520 through the opening 416 of the second baseline fixture 402 with an alignment mark (not shown) so as to place the bridge member 120 onto the first and second chips 100A, 100B. The manufacturing process may also include a step of elevating the temperature, a step of performing solder joining and a step of cooling down. If the pre-applied underfill material is not employed, a step of suppling reduction gas may be performed.

Figure 14C:
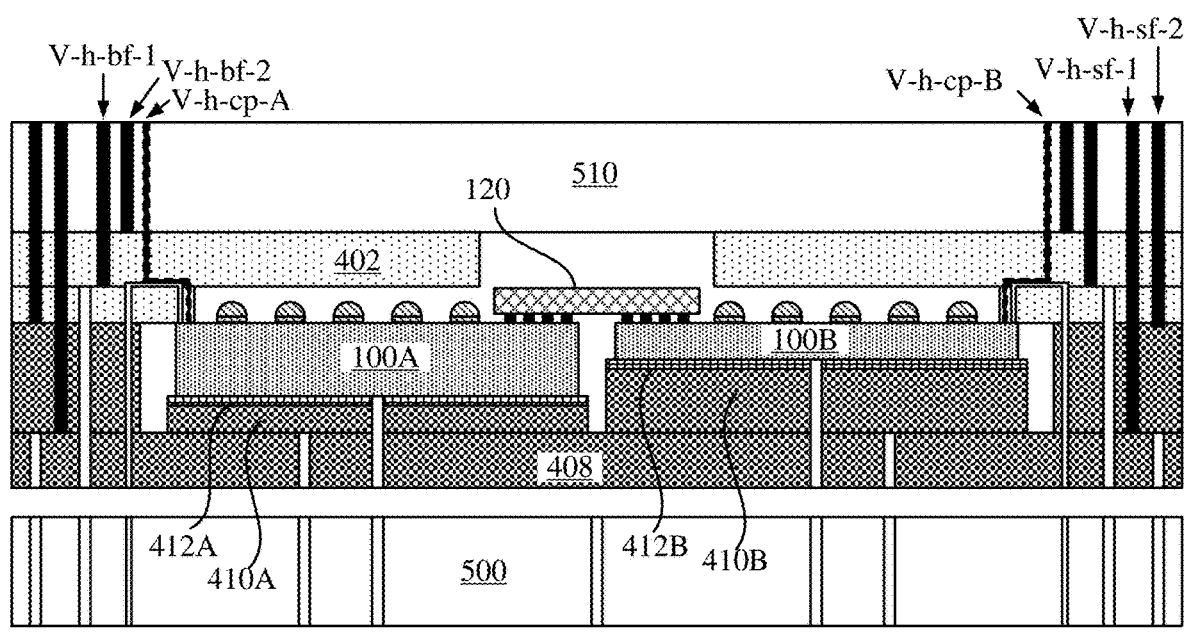
FIG. 14C is a cross-sectional view of the chip handle structure depicting the steps of releasing the bonded bridge member from the handler body of the bridge handler and pulling the handler body of the bridge handler out of the fixtures through the opening, according to an embodiment of the present invention.

As shown in FIG. 14C, the manufacturing process may include a step of releasing the bonded bridge member 120 from the handler body of the bridge handler 520 and a step of pulling the handler body of the bridge handler 520 out of the fixtures through the opening 416. The manufacturing process may include a step of attaching the bonding head 510 to the fixtures 402-408, 410A, 410B and a step of sucking the chip handling fixtures 402-108,410A,410B by turning on the suction line V-h-sf-1, V-h-sf-2, V-h-bf-1, V-h-bf-2, V-h-cp-A, V-h-cp-B. The manufacturing process may include a step of turning off all the suction functions of the bonding stage 500 (V-s-**-*), releasing and picking up from the fixtures 402-408, 410A, 410B from the bonding stage 500.

Figure 15A:
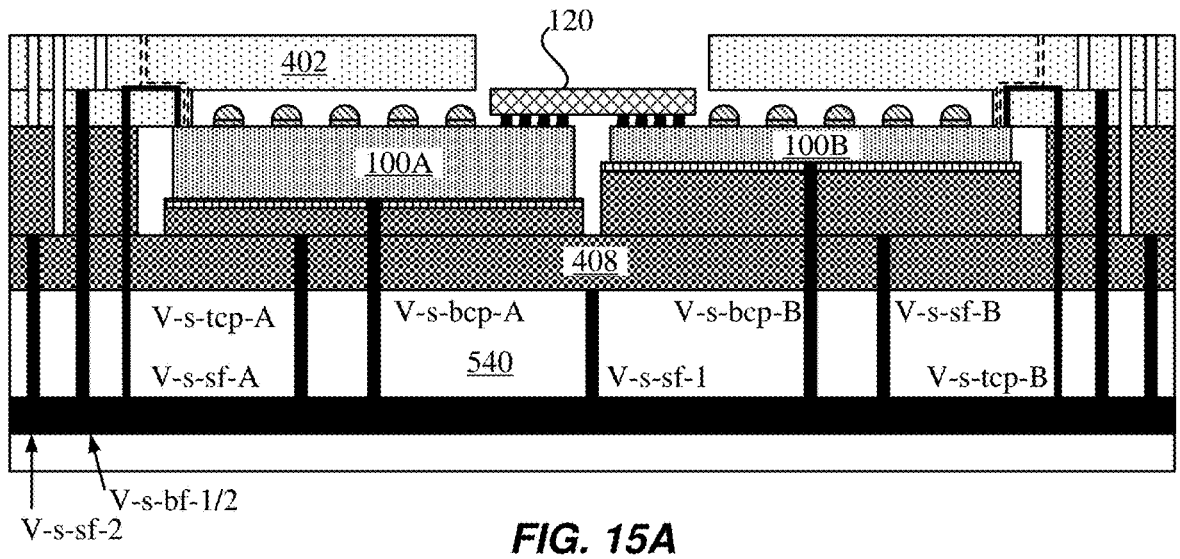
FIG. 15A is a cross-sectional view of the chip handle structure depicting the step of placing the chip handling fixtures with the bridged module on a carrier, according to an embodiment of the present invention.

As shown in FIG. 15A, the manufacturing process may include a step of placing the chip handling fixtures 402-108, 410A, 410B with the bridged module 150 on a carrier 540, followed by fixing by suction and closing suction line to keep vacuum. The manufacturing process may include a step of curing the pre-applied underfill material. If the pre-applied underfill material is not employed, an underfill dispensing process by using a jet dispenser may be performed before curing.

Figure 15B:
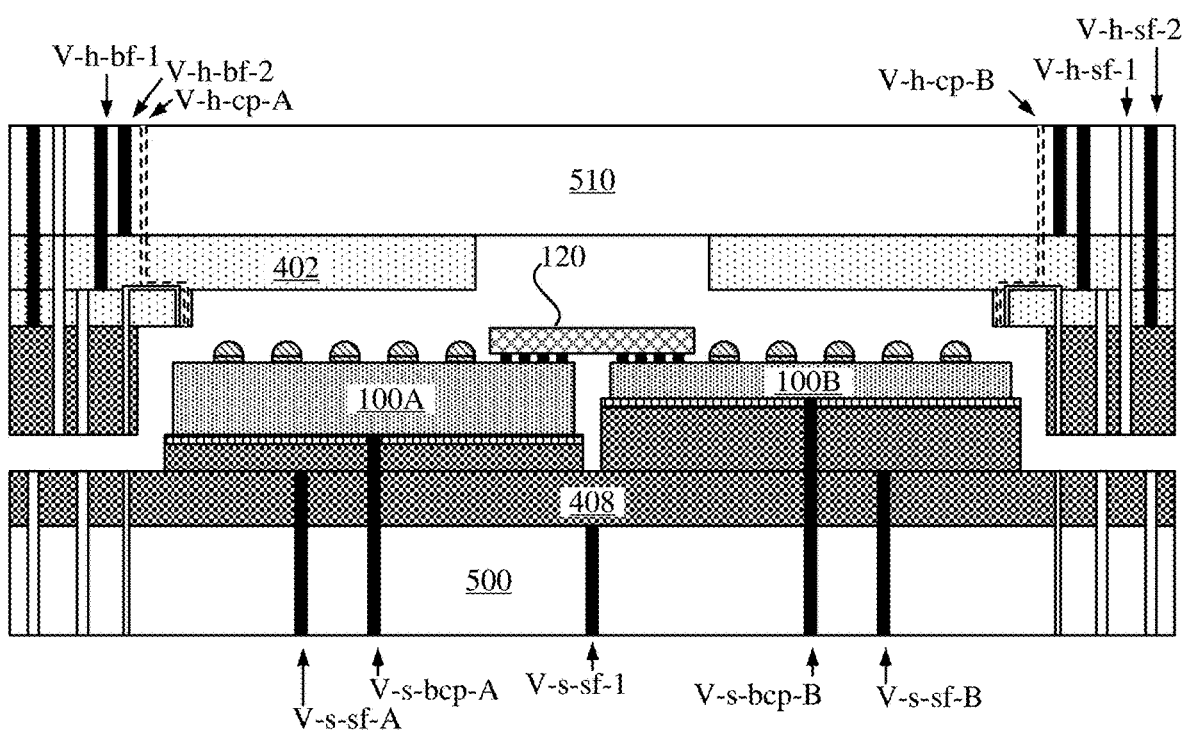
FIG. 15B is a cross-sectional view of the chip handle structure depicting the step of picking up and placing the chip handling fixture on the bonding stage, according to an embodiment of the present invention.

As shown in FIG. 15B, the manufacturing process may include a step of picking up and placing the chip handling fixture 408, 410A, 410B on the bonding stage 500 and releasing the baseline fixture 402,404 and the second stage fixture 406 from the bonding stage 500 by the bonding head 510 by turning off the suction lines V-h-sf-1, V-h-cp-A, V-h-cp-B.

Figure 15C:
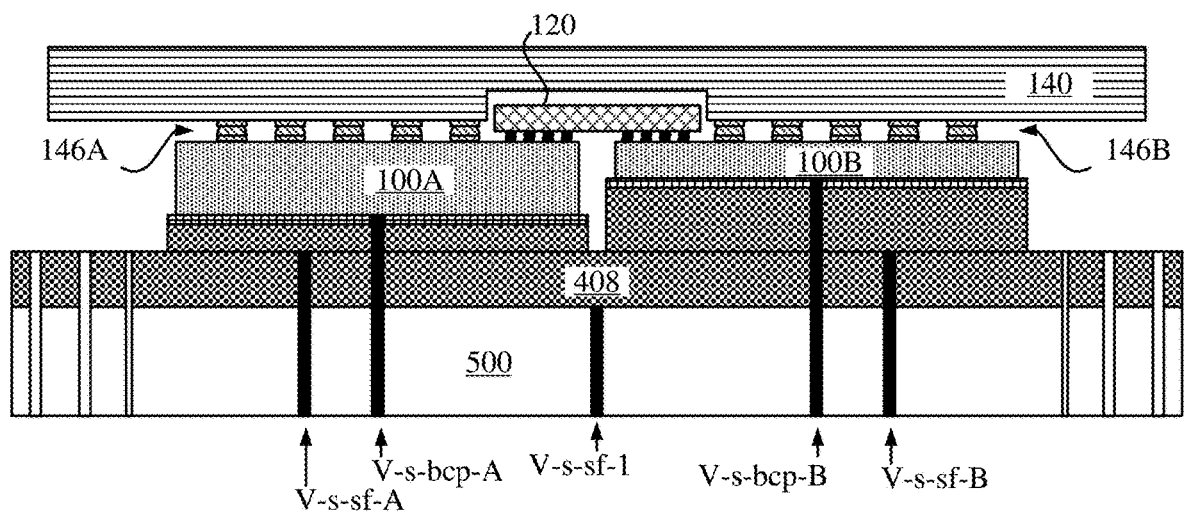
FIG. 15C is a cross-sectional view of the chip handle structure depicting the step of bonding the substrate on the bridged module, according to an embodiment of the present invention.
Figure 16A:
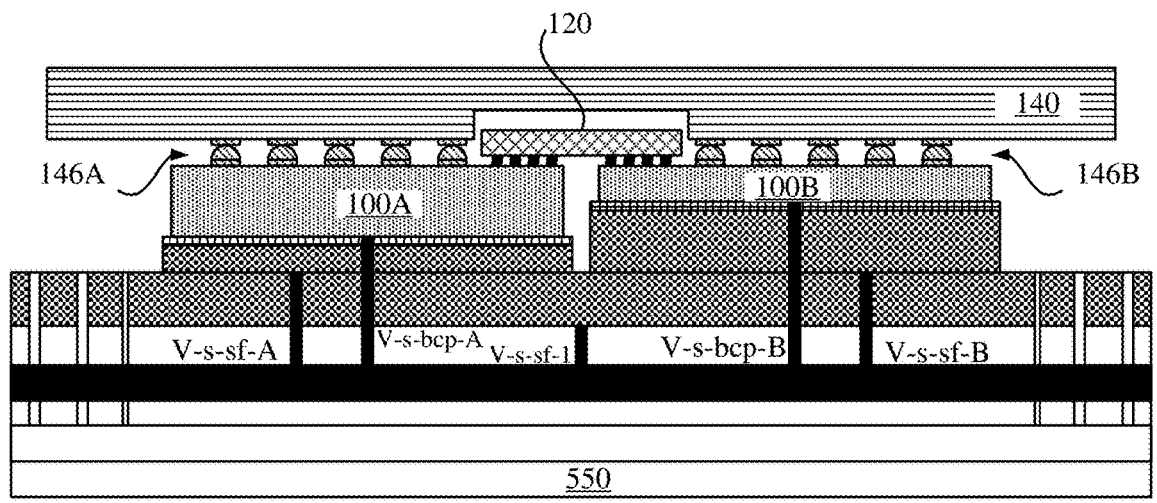
FIG. 16A is a cross-sectional view of the chip handle structure depicting conducting the steps of FIGS. 15B-15C on a carrier, according to an embodiment of the present invention.
Figure 16B:
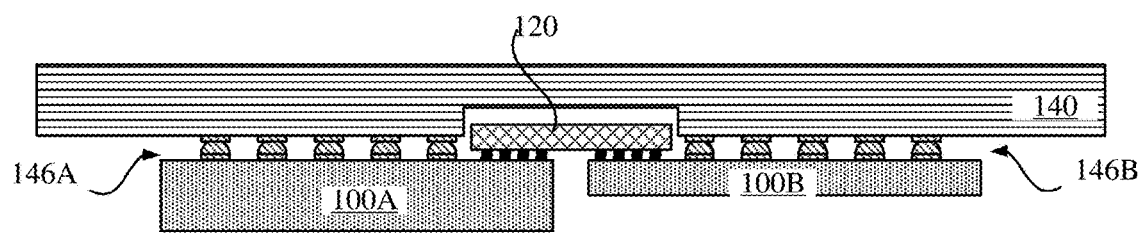
FIG. 16B is a cross-sectional view of the chip handle structure depicting obtaining the bridged multichip module including semiconductor chips, the bridge member and the substrate, according to an embodiment of the present invention.

As shown in FIG. 15C, the manufacturing process may include a step of bonding the substrate 140 on the bridged module 150. As shown in FIG. 16A, optionally, the steps described in the series of FIGS. 15B-15C can be also done on the carrier 540. As shown in FIG. 16B, the bridged multichip module including the chips 100A, 100B, the bridge member 120 and the substrate 140 is obtained.

With reference to the series of FIGS. 17A-17D, a schematic of a process for manufacturing a bridged multichip module using a set of chip handling fixtures is described, according to an embodiment of the present invention. Note that FIGS. 17A-17D also show cross-section views. During the course of the process shown in the series of FIGS. 13A-13C, FIGS. 14A-14C, FIGS. 15A-15C and FIGS. 16A-16B, the chips 100A, 100B are mounted with their front surfaces 102A, 102B facing up (face toward the bonding head 510) and the chips 100A, 100B are not flipped during the process. The exemplary embodiment shown in FIGS. 17A-17D is a variant of the process where the chips 100A, 100B are mounted with their front surfaces 102A, 102B facing down (facing towards the bonding stage 500) during the process.

As shown in FIGS. 17A-17D, the fixtures used for handling chips is the same as those shown in FIG. 10A,10B, however, the stacking order of the fixtures 402, 404, 406, 408, 410A,410B is reversed.

Figure 17A:
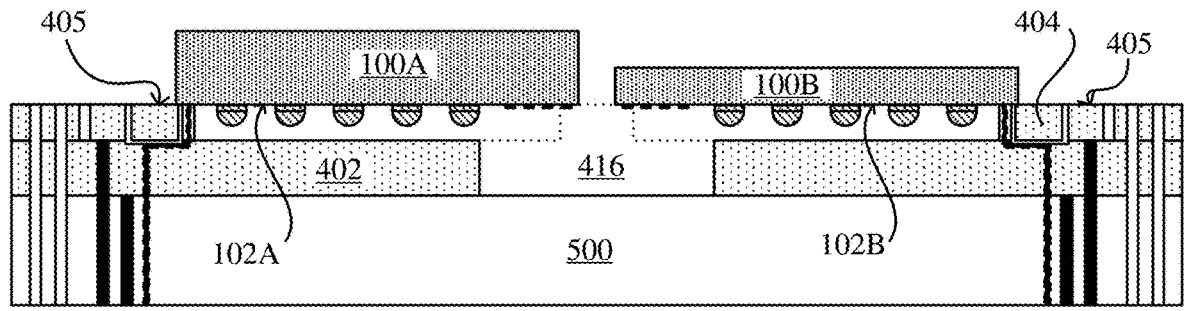
FIG. 17A is a cross-sectional view of a set of chip handling fixtures during a first step of process for manufacturing a bridged multichip module using the set of chip handling fixtures, according to an embodiment of the present invention.

The situation shown in FIG. 17A corresponds to the situation shown in FIG. 13B. As shown in FIG. 17A, the first and second chips 100A, 100B are attached to the support surface 405 provided by the first baseline fixture 404. The chips 100A, 100B are mounted to the fixtures 402, 404 with their front surfaces 102A, 102B facing down.

Figure 17B:
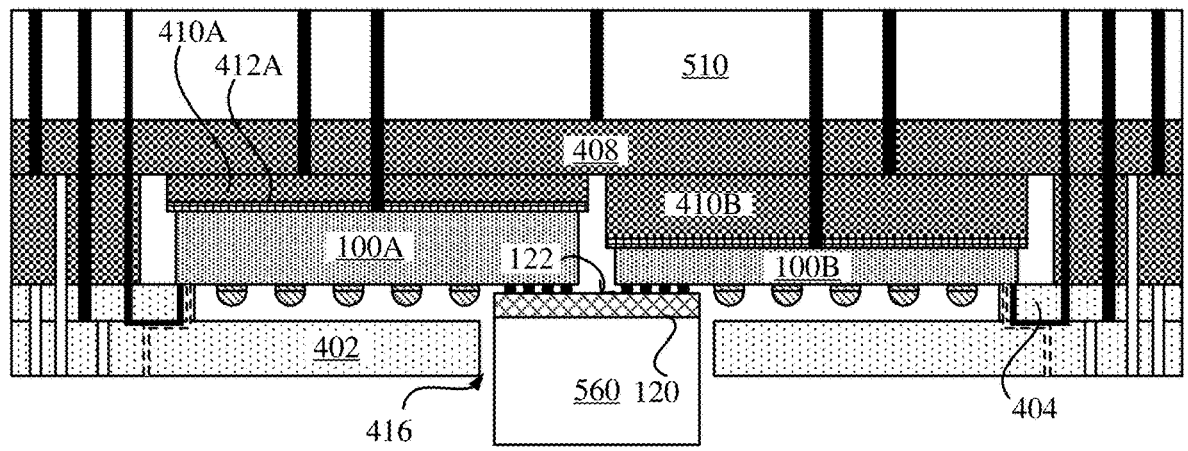
FIG. 17B is a cross-sectional view of the chip handle structure depicting the step of inserting the bridge member by the bridge handler through the opening of the second baseline fixture, according to an embodiment of the present invention.

The situation shown in FIG. 17B corresponds to the situation shown in FIG. 14B. As shown in FIG. 17B, the chips 100A, 100B are held by the set of chip handling fixtures 402-408, 410A, 410B and the bridge member 120 is inserted by the bridge handler 560 through the opening 416 of the fixture 402. The bridge member 120 is bonded to the chips 100A, 100B with its front surface 122 facing up.

Figure 17C:
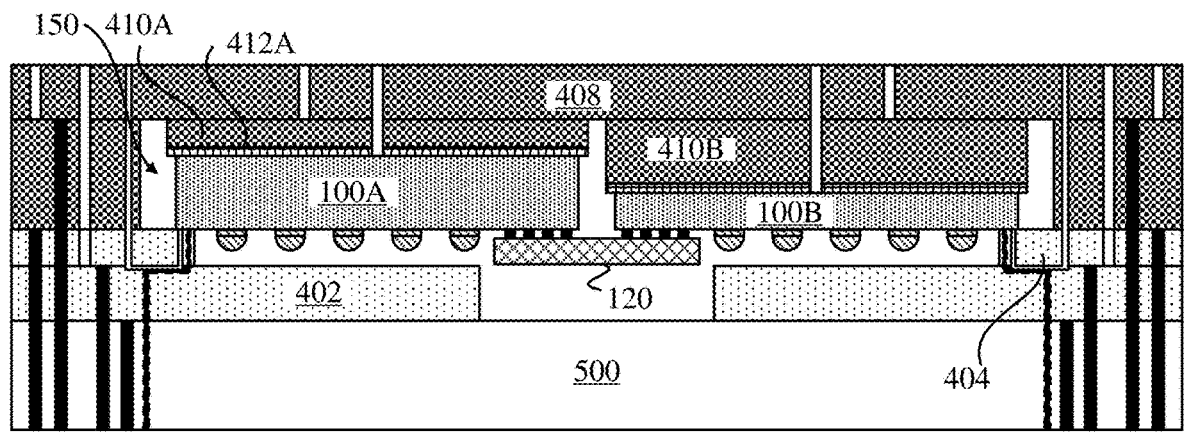
FIG. 17C is a cross-sectional view of the chip handle structure depicting the steps of releasing the bonded bridge member from the handler body of the bridge handler and pulling the handler body of the bridge handler out of the fixtures through the opening, according to an embodiment of the present invention.

The situation shown in FIG. 17C corresponds to the situation shown in FIG. 14C. As shown in FIG. 17C, the bridged module 150 and the fixtures 402-408, 410A, 410B are attached to the bonding stage 500 and the bonding head 510 are released from the fixtures 402-408, 410A, 410B.

Figure 17D:
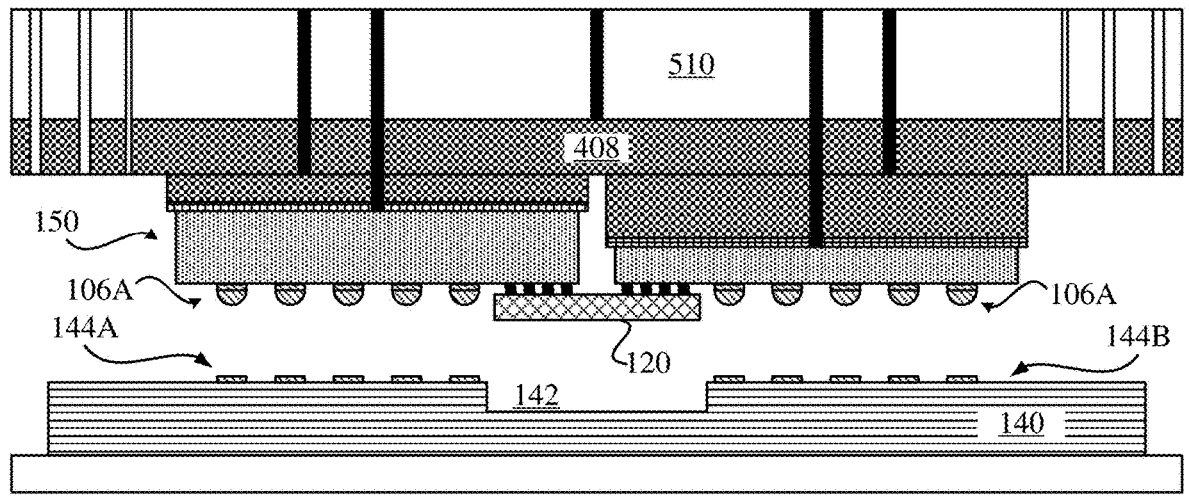
FIG. 17D is a cross-sectional view of the chip handle structure depicting the step before the bonding step shown in FIG. 15C, according to an embodiment of the present invention.

The situation shown in FIG. 17D corresponds to a situation just before the boding step shown in FIG. 15C. As shown in FIG. 17D, the substrate 140 with the contact pads 144A, 144B formed on its surface are prepared. The second sets of terminals 108A 108B of the chips 100A, 100B are aligned to the contact pads 144A, 144B of the substrate 140 and the bridged module 150 would be placed to the substrate 140.

With reference to a series of FIG. 13B, FIGS. 18A-18C, a schematic of an apparatus and a process for manufacturing a bridged multichip module using a set of chip handling fixtures according to further other exemplary embodiment of the present invention is described. Note that FIGS. 18A-18C also show cross-section views. The exemplary embodiments shown in FIGS. 6A-8D, FIGS. 11A-16B and FIG. 17A-17D, the positional relationship between the surface of the first base part 252A and the second base part 252B and between the fixtures 410A, 410B are fixed. In contrast, the apparatus shown in FIGS. 18A-18C has a plurality of chip bonding stages 500A, 500B for supporting the chips 100A, 100B and a peripheral bonding stage 500C. The bonding stages 500A, 500B are controlled independently by individual Z positioning modules for adjusting the height of the surface where the corresponding chip 100A/100B are supported. The level of the peripheral bonding stage 500C may be fixed.

As shown in FIG. 13B, the first and second chips 100A, 100B are attached to the support surface 405 that is provided by the first baseline fixture 404.

Figure 18A:
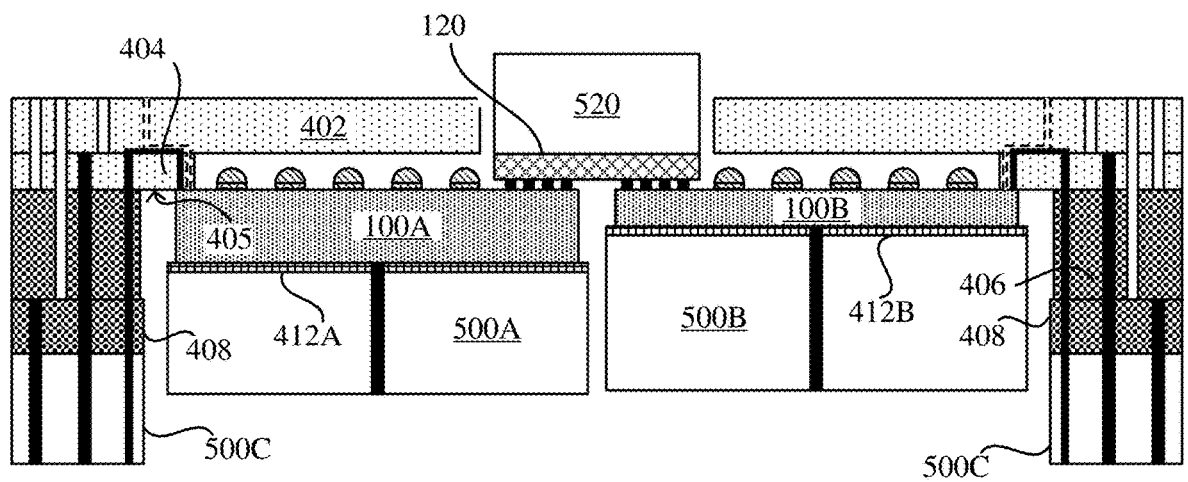
FIG. 18A shows a schematic of an apparatus and a process for manufacturing a bridged multichip module using the set of chip handling fixtures, according to an embodiment of the present invention.
Figure 18B:
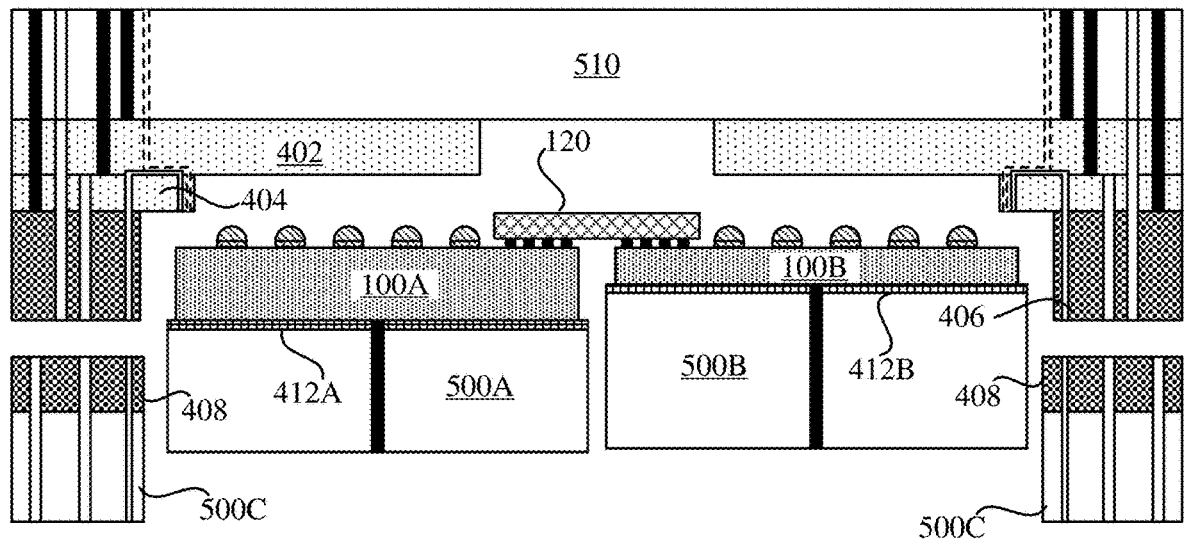
FIG. 18B is a cross-sectional view of the chip handle structure depicting the step of inserting the bridge member by the bridge handler through the opening of the second baseline fixture, according to an embodiment of the present invention.

The situation shown in FIG. 18A corresponds to the situation shown in FIG. 14B. As shown in FIG. 18B, the chips 100A, 100B are held by the set of chip handling fixtures 402-408, 410A, 410B. The fixtures 402, 404, 408 are stacked on the peripheral bonding stage 500C. The front surface 102A of the first chip 100A and the front surface 102B of the second chip 100B are aligned vertically by the support surface 405 of the first baseline fixture 404 and backed up by the bonding stage 500A, 500B whose height are adjusted. The bridge member 120 is inserted by the bridge handler 520 through the opening 416 of the second baseline fixture 402.

Figure 18C:
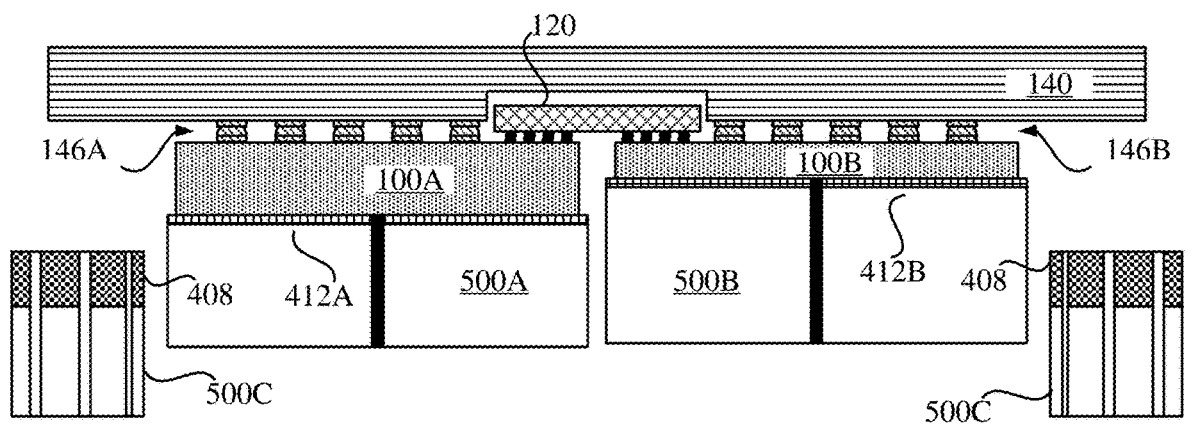
FIG. 18C is a cross-sectional view of the chip handle structure depicting the step of bonding the substrate on the bridged module, according to an embodiment of the present invention.

The situation shown in FIG. 18B corresponds to the situation shown in FIG. 15B. As shown in FIG. 18C, the baseline fixtures 402,404 and the second stage fixture 406 are released from the bridge module 150 placed on the plurality of bonding stages 500A, 500B. The baseline fixtures 402,404 and the second stage fixture 406 are also separated from the peripheral bonding stage 500C.

The situation shown in FIG. 18C corresponds to the situation shown in FIG. 15C. As shown in FIG. 18C, the substrate 140 are mounted to the bridge module 150 placed on the plurality of bonding stages 500A, 500B.

In the embodiments described above, the set of holes is fabricated at the support surface 204 of the chip handler 200 or the support surface 405 of the baseline fixture 404 as a part of the fixing mechanism for fixing the first and second chips 100A, 100B to the support surface (204, 405). In one or more embodiments, the first surfaces 102A, 102B of the chips 100 are fixed to the support surface (204, 405) by a fixing member, where the fixing member is selected from a group consisting of an adhesive material, a pair of a metal stud bump and a pad and a pair of a solder bump and a pad.

With reference to FIGS. 19A-19D, a plurality of fixing members that can be used in one or more embodiments of the present invention are described.

Figure 19A:
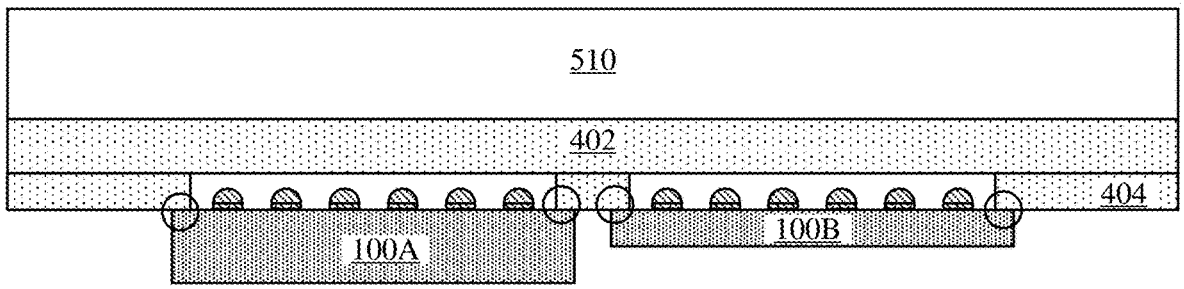
FIG. 19A is a cross-sectional view of the chip handle structure depicting a plurality of fixing members, according to an embodiment of the present invention.

FIG. 19B describes a case of using an adhesive material as the fixing member. The cross-section view shown in FIG. 19B corresponds to an enlarged view of a portion where the circle points at in FIG. 19A. As shown in FIG. 19B, depending on chip surface roughness or structures, an adhesive layer or tape 604 can be laminated on the first baseline fixture 404 with a hole or channel 602 for the gas to pass through. Magic resin can be used as the material of the adhesive layer 604. In addition to the suction by the holes 602, the adhesive layer 604 provides additional adhesivity to the support surface 405. Fixing between the support surface 405 and the first surfaces 102 of the chips 100 can be controlled by utilizing suction or exhaust of gas passing through the channel 602. Hence, in addition to, or in place of the suction by the holes 602, the hole 602 can be used to apply positive pressure to the front surface 102 of the chips 100 for easier chip release with appropriate temperatures (lower adhesion at higher temperatures).

FIG. 19C describes a case of using a pair of a metal stud bump and a pad as a fixing member. The cross-section view shown in FIG. 19C corresponds to an enlarged view of a portion where the circle points at in FIG. 19A in the case of using the metal stud bump and the pad. As shown in FIG. 19C, the chip 100 includes a pad 622 and a metal stud bump 624 formed on the pad 622 and a passivation layer 630 that is formed over the front surface 102 of the chip 100 and exposes the pad 622 formed thereon. The first baseline fixture 404 has a pad 626 formed on the support surface 405 thereof. In a particular embodiment, the pad 622 may be an Al pad and the metal stud bump may be an Au stud bump. The Al pad 622 and the Au stud bump 624 are formed at dicing street or chip peripheral. The pad 626 may be Ni/Au pad. The pair of the metal stud bump 624 and the pad 622 can be used instead of vacuum suction lines as the fixing member.

Figure 19D:
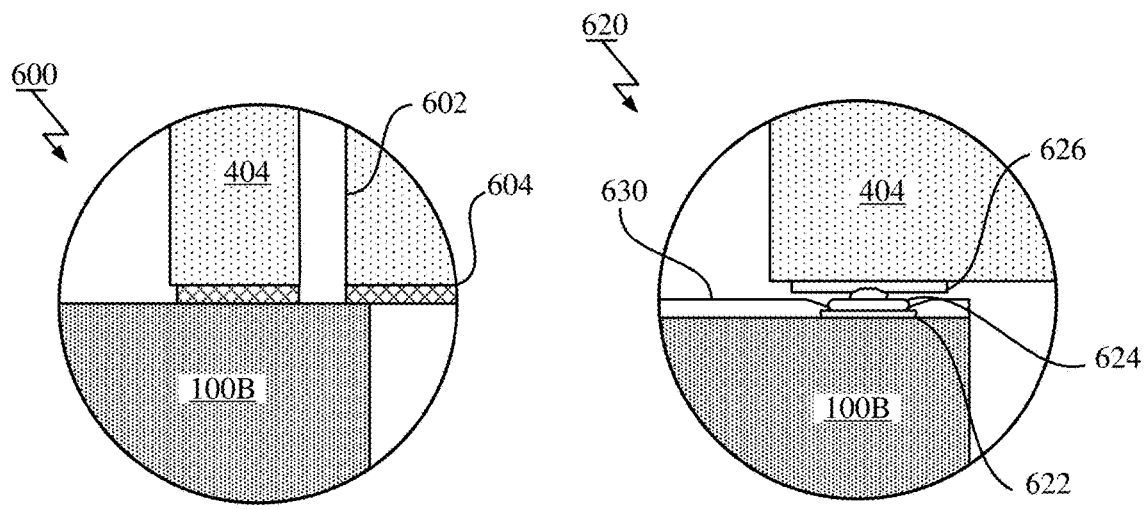
FIG. 19D is a detailed view of the chip handle structure of FIG. 19A depicting using a pair of a solder bump and a pad as a fixing member, according to an embodiment of the present invention.
Figure 19D:
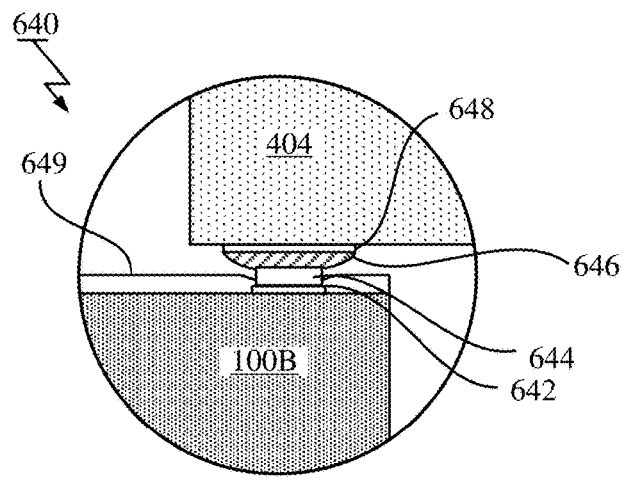

FIG. 19D describes a case of using a pair of a solder bump and a pad as a fixing member. The cross-section view shown in FIG. 19D corresponds to an enlarged view of a portion where the circle points at in FIG. 19A in the case of using the solder bump and the pad. As shown in FIG. 19D, the chip 100 includes a pad 642 and a pillar bump 644 with a solder cap formed on the pad 642 and a passivation layer 649 that is formed over the front surface 102 of the chip 100 and exposes the pad 642 formed thereon. The first baseline fixture 404 has a pad 648 formed on the support surface 405 thereof. The pillar bump 644 and the pad 648 with the solder cap is joined by solder joining process. In a particular embodiment, the pad 642 may be an Al pad and the pillar bump a Cu pillar bump with the solder cap. The Al pad 642 and the Cu pillar bump 644 with the solder cap 646 are formed at dicing street or chip peripheral. The pad 648 may be a Ni/Au or a Cu pad. The pair of the solder bump (the pillar bump 644 and the solder cap 646) and the pad 648 can be used instead of vacuum suction lines as the fixing member.

FIGS. 20A-20D describe an example process flow in a case of using a pair of a solder bump and a pad as a fixing member according to a particular embodiment of the present invention. Note that in FIGS. 20A-20D merely the baseline fixtures 402, 404 and the plurality of chips 100A, 100B, the bridge member 120 and fixing members are described. Since low melting point metals are used for bridging and for joining to the substrate, appropriate temperature management is requested when the pair of the solder bump and the pad is used as the fixing member. In the examples shown in FIGS. 20A-20D, the solder bump for fixing the front surface 102 of the chip 100 to the support surface is SnZn having the melting point of 199 degree Celsius. The bump for bridging is In having the melting point of 155.6 degree Celsius or SnBi having the melting point of 139 degree Celsius, that is formed on Cu UBM (under bump metallurgy). The solder bump for joining to the substrate is SnAg having the melting point of 221 degree Celsius or SnAgCu having the melting point of 217 degree Celsius.

Figure 20A:
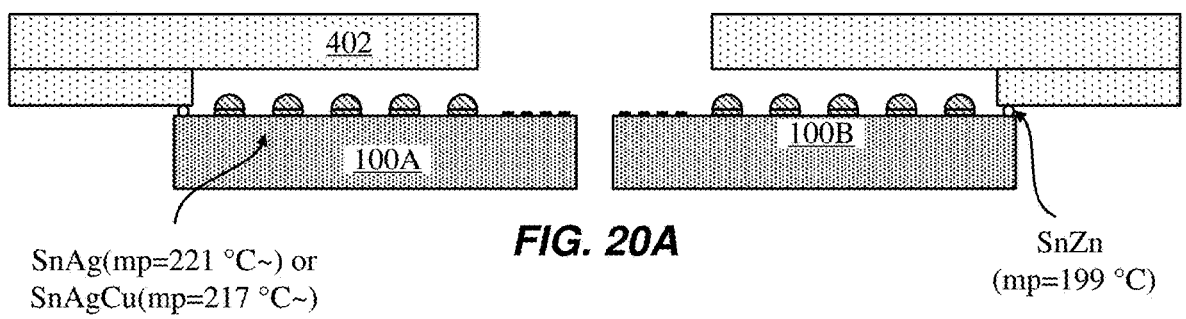
FIG. 20A describes a first step of an example process flow in which a pair of solder bumps and a pad are used as a fixing member, according to an embodiment of the present invention.

As shown FIG. 20A, the example process flow includes a step of performing temporary bonding by elevating the temperature above 199 degree Celsius, which is the melting point of the fixing solder bump and below the melting point of the joining bump (221/217 degree Celsius).

Figure 20B:
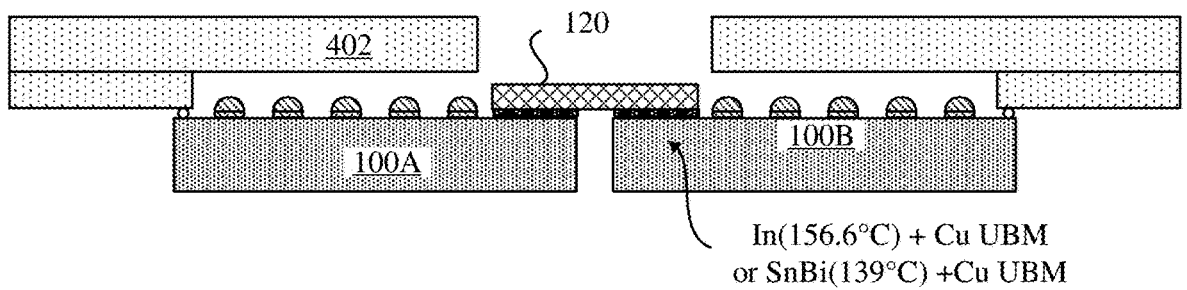
FIG. 20B describes the step of performing bridging bonding, according to an embodiment of the present invention.

As shown FIG. 20B, the flow includes a step of performing bridging bonding under the temperature above 157 or 139 degree Celsius, which is the melting point of the bridging bump and below the melting point of the joining bump.

Figure 20C:
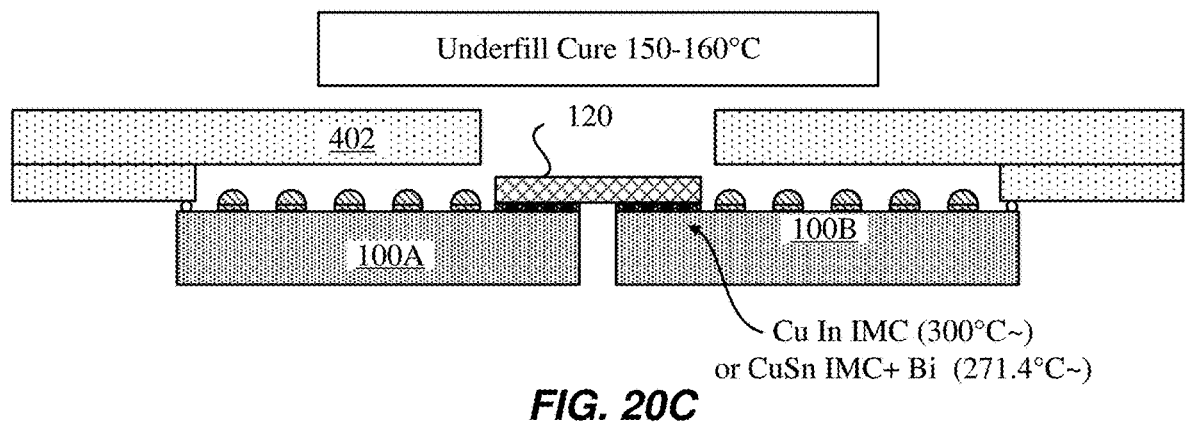
FIG. 20C describes the step of curing the underfill, according to an embodiment of the present invention.

As shown FIG. 20C, the flow includes a step of performing curing the underfill under a typical temperature range for curing underfill, (e.g., 150-160 degree Celsius). Note that since the bridging has been already performed, the metal of the bridging bump is converted into intermetallic compound that has generally higher melting point. For example, the intermetallic compound of CuIn has the melting point more than 300 degree Celsius. The Intermetallic compound of CuSn and Bi has the melting point more than 271.4 degree Celsius.

Figure 20D:
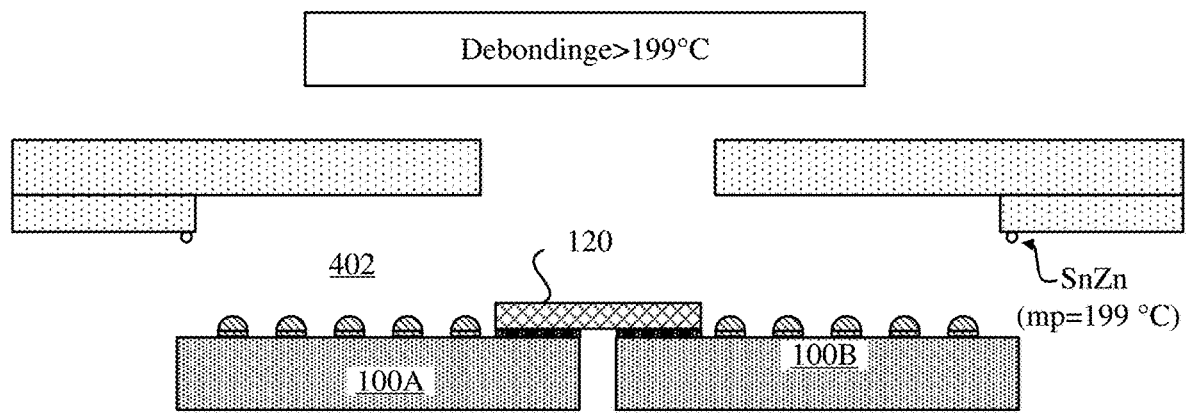
FIG. 20D describes the step of performing debonding by elevating a temperature, according to an embodiment of the present invention.

As shown FIG. 20D, the flow includes a step of performing debonding by elevating the temperature above 199 degree Celsius, which is the melting point of the fixing solder bump and below the melting point of the joining bump.

The embodiments described above provide chip handling fixtures for interconnecting two chips 100A, 100B by one bridge member 120. Also, the front surfaces 102A, 102B of the first and second chips 100A, 100B are supported merely at the peripheral region of each chip 100. However, the number of chips to be interconnected is not limited and the number of bridge members to be used to interconnect the chips is also not limited. Furthermore, the front surfaces 102 of the chips 100 may be supported at not only the peripheral region but also central region of each chip 100.

Figure 21A:
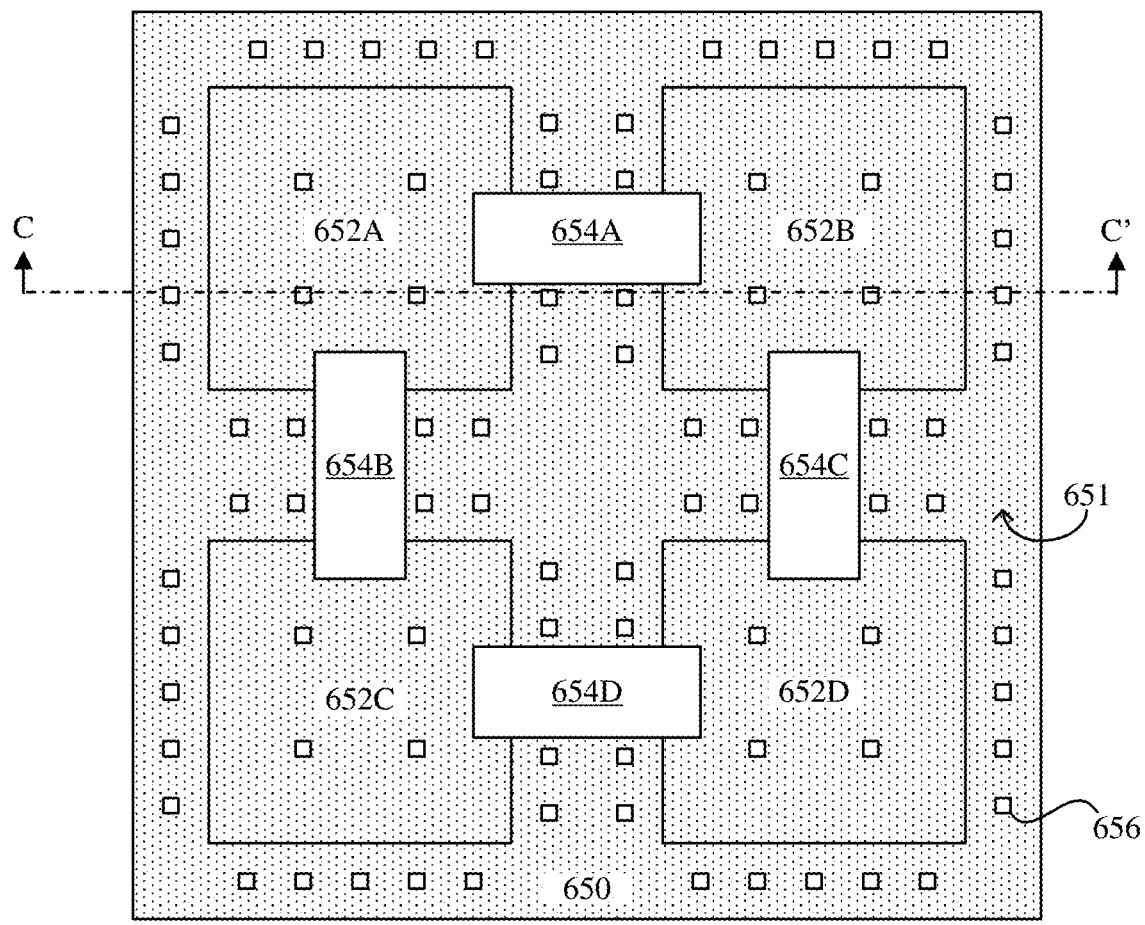
FIG. 21A is a top view of the chip handling fixture depicting a variant of a chip handling fixture corresponding to the baseline fixtures shown in FIG. 10, according to an embodiment of the present invention.
Figure 21B:
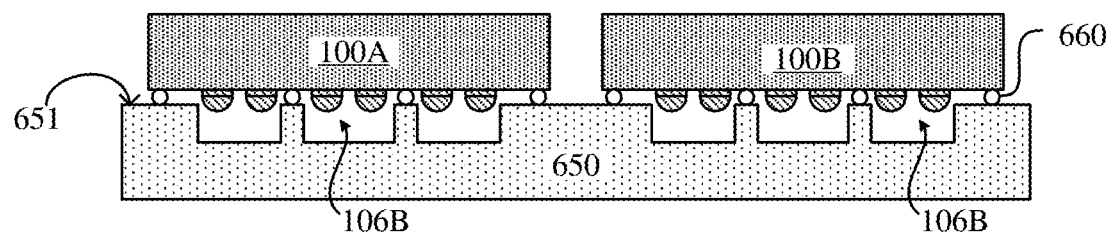
FIG. 21B is a cross-section view of the chip handling fixture with mounted semiconductor chips, according to an embodiment of the present invention.

FIGS. 21A-21B describe a schematic of a variant of a chip handling fixture corresponding to the baseline fixtures 403, 404 shown in FIG. 10, according to an embodiment of the present invention. FIG. 21A shows a top view of the chip handling fixture 650 whereas FIG. 21B shows a cross-section view of the chip handling fixture 650 with chips 100 mounted thereon. Note that cross-section view shown in FIG. 21B corresponds to the cross-section denoted by a one-dot chain line C-C' in the top view of FIG. 21A.

The baseline fixture 650 shown in FIGS. 21A-21B is a chip handling fixture for interconnecting four chips 100A, 100B, 100C, 100D by four bridge members, which are not shown in FIGS. 21A-21B. The four bridge members may include a first bridge for connecting the chips 100A, 100B, a second bridge for connecting the chips 100B, 100D, a third bridge for connecting the chips 100C, 100D and a fourth bridge for connecting the chips 100A, 100C.

As shown FIGS. 21A-21B, the chip handling fixture 650 includes a cavity 652 for each chip 100 to be mounted and an opening 654 for each bridge member. Each cavity 652 accommodates terminals 106 (and also 108) of the corresponding chip 100. For instance, the cavity 652A accommodates the terminals 106A (and also 108A) of the first chip 100A. Each opening 654 is used for each bridge member to be inserted therethrough. The chip handling fixture 650 also has a support surface 651 for support the front surface 102A, 102B, 102C, 102D of the chips 100A, 100B, 100C, 100D. The support surface 651 may include a plurality of surface regions separated from each other, which includes additional support surfaces located at the central region of each chip 100. The support surface 651 has a plurality of pads 656 formed thereon, where the bump of the chip 100 would be placed to form a solder joint 660 for fixing.

According to the aforementioned embodiments, multi-chip interconnection technique capable of aligning a plurality of chips and a bridge member appropriately and handling the chips and the bridge member appropriately during bridging process is provided.

The apparatus, method, and the chip handler according to the exemplary embodiments of the present invention enables accurate alignment between a plurality of chips and between each of the chips and the bridge member since the chip handler provides functionality of pre-alignment between the plurality of chips. The bridge member is placed on areas on the chips, which are pre-aligned against the chip handler, and then the bridged multiple chips would be bonded to a substrate simultaneously. Also, the plurality of chips and the intermediate bridged structure are appropriately supported by the at least one support surface of the chip handler during the bridging process.

Although the advantages obtained with respect to the one or more specific embodiments according to the present invention have been described, it should be understood that some embodiments may not have these potential advantages, and these potential advantages are not necessarily required of all embodiments.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification, specify the presence of stated features, steps, layers, elements, and/or components, but do not preclude the presence or addition of one or more other features, steps, layers, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more aspects of the present invention has been presented for purposes of illustration and description but is not intended to be exhaustive or limited to the invention in the form disclosed.

Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for interconnecting a first chip and a second chip, comprising:

mounting the first chip and the second chip to a chip handler having an opening and at least one support surface, each of the first chip and the second chip having a first surface including a first set of terminals and a second surface opposite to the first surface, wherein the first surface of the first chip and the first surface of the second chip mounted to the chip handler are supported by the at least one support surface of the chip handler;

placing the first chip and the second chip on a chip support member with the chip handler from the second surfaces; and inserting a bridge member by a bridge handler through the opening of the chip handler to place the bridge member onto the first sets of terminals of the first chip and the first sets of terminals of the second chip that are exposed from the opening.

2. The method of claim 1, wherein the method further comprises:

assembling the chip handler, the chip support member and the bridge handler to provide a chamber space accommodating the first sets of terminals of the first chip and the second chip and terminals of the bridge member inside the chamber space.

3. The method of claim 2, wherein the method further comprises:

suppling a reduction gas into the chamber space to clean the first sets of terminals of the first chip and the second chip and the terminals of the bridge member.

4. The method of claim 1, wherein mounting the first chip and the second chip to the chip handler comprises:

sucking, by a plurality of first holes formed on the at least one support surface, the first surface of the first chip; and sucking, by a plurality of second holes formed on the at least one support surface, the first surface of the second chip.

5. The method of claim 1, wherein mounting the first chip and the second chip to the chip handler comprises:

sucking the first surfaces of the first chip and the second chip by a first set of holes formed on the at least one support surface and routed from one of a bonding stage side and a bonding head side, wherein placing the first chip and the second chip on the chip support member comprises:

sucking the first surfaces of the first chip and the second chip by a second set of holes formed on the at least one support surface and routed from other of the bonding stage side and the bonding head side; and releasing the chip handler from the one of the bonding stage side and the bonding head side.

6. The method of claim 1, wherein the method further comprises:

releasing a bridged module, including the first chip, the second chip and the bridge member bonded to the first chip and the second chip, from the chip handler; and mounting the bridged module on a substrate.

7. The method of claim 1, wherein the bridge member has third sets of terminals and the method further comprises:

dispensing an underfill material, from a side of the second surfaces, to a place around joints between the first sets of terminals of the first chip and the second chip and the third sets of terminals of the bridge member; and curing the underfill material.

8. The method of claim 1, wherein the bridge handler comprises:

a handler body for attaching the bridge member; and a gas leakage stopper for closing the opening of the chip handler.

* * * * *